United States Patent
Chen et al.

(10) Patent No.: US 12,506,029 B2
(45) Date of Patent: Dec. 23, 2025

(54) GAP FILLING METHOD IN SEMICONDUCTOR MANUFACTURING PROCESS

(71) Applicant: TAIWAN SEMICONDUCTOR MANUFACTURING COMPANY, LTD., Hsinchu (TW)

(72) Inventors: Yi-Hsiu Chen, Hsinchu (TW); Shao-An Wang, Hsinchu (TW); Kenichi Sano, Hsinchu (TW); Andrew Joseph Kelly, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 792 days.

(21) Appl. No.: 17/854,474

(22) Filed: Jun. 30, 2022

(65) Prior Publication Data
US 2024/0006229 A1   Jan. 4, 2024

(51) Int. Cl.
*H01L 21/762* (2006.01)
*H01L 21/768* (2006.01)

(52) U.S. Cl.
CPC .. *H01L 21/76224* (2013.01); *H01L 21/76829* (2013.01); *H01L 21/76865* (2013.01); *H01L 21/76879* (2013.01)

(58) Field of Classification Search
CPC ......... H01L 21/76879; H01L 21/76843; H01L 21/76865; H01L 21/76877; H01L 23/5226; H01L 21/76837; H10D 84/00; H10D 86/01
See application file for complete search history.

(56) References Cited

U.S. PATENT DOCUMENTS

| | | | | |
|---|---|---|---|---|
| 4,942,137 A * | 7/1990 | Sivan | | H01L 21/32 257/E21.258 |
| 5,872,058 A * | 2/1999 | Van Cleemput | | H01L 21/76837 257/E21.546 |
| 6,265,269 B1 * | 7/2001 | Chen | | H10D 64/516 438/269 |
| 7,981,763 B1 * | 7/2011 | van Schravendijk | | H01L 21/02274 257/E21.546 |
| 8,039,381 B2 * | 10/2011 | Yeh | | H10D 64/518 257/E21.64 |
| 8,524,612 B2 * | 9/2013 | Li | | C23C 16/401 438/762 |
| 8,633,113 B2 * | 1/2014 | Tay | | H10D 64/513 257/E21.546 |
| 8,941,089 B2 * | 1/2015 | Gopalan | | H10N 70/8836 257/3 |
| 9,263,316 B2 * | 2/2016 | Wu | | H01L 21/31055 |
| 9,305,840 B2 * | 4/2016 | Yu | | H01L 21/76879 |
| 10,553,679 B2 * | 2/2020 | Zhang | | H10D 64/62 |

(Continued)

*Primary Examiner* — Maliheh Malek
(74) *Attorney, Agent, or Firm* — Birch, Stewart, Kolasch & Birch, LLP

(57) ABSTRACT

A method for filling a gap in a semiconductor structure includes: forming the gap between two raised portions of the semiconductor structure, the gap having a bottom surface and two lateral surfaces each extending upwardly from the bottom surface along one of the raised portions to terminate at an upper surface of a corresponding one of the raised portions; and forming a filler element in the gap in a bottom-up manner that avoids the filler element being formed laterally.

20 Claims, 16 Drawing Sheets

(56) References Cited

U.S. PATENT DOCUMENTS

| | | | | |
|---|---|---|---|---|
| 11,749,730 B2* | 9/2023 | Huang | | H10D 64/62 |
| | | | | 257/734 |
| 12,040,224 B2* | 7/2024 | Li | | H01L 23/5329 |
| 2005/0037610 A1* | 2/2005 | Cha | | H01L 21/76227 |
| | | | | 257/E21.547 |
| 2008/0061341 A1* | 3/2008 | Lung | | H10B 63/30 |
| | | | | 257/532 |
| 2008/0258268 A1* | 10/2008 | Cheng | | H10B 12/0387 |
| | | | | 438/386 |
| 2009/0286381 A1* | 11/2009 | van Schravendijk | | |
| | | | | H01L 21/76801 |
| | | | | 257/E21.546 |
| 2010/0041179 A1* | 2/2010 | Lee | | H01L 21/02277 |
| | | | | 438/584 |
| 2013/0203249 A1* | 8/2013 | Nalla | | H01L 21/76865 |
| | | | | 438/643 |
| 2013/0277752 A1* | 10/2013 | Glass | | H01L 23/535 |
| | | | | 257/369 |
| 2015/0179514 A1* | 6/2015 | Yu | | H01L 21/76865 |
| | | | | 438/643 |
| 2015/0311114 A1* | 10/2015 | Huang | | H01L 23/528 |
| | | | | 257/773 |
| 2016/0190320 A1* | 6/2016 | Chong | | H10D 84/0188 |
| | | | | 257/192 |
| 2017/0117240 A1* | 4/2017 | Weng | | H05K 1/113 |
| 2017/0125247 A1* | 5/2017 | Kim | | B81C 1/00031 |
| 2018/0130707 A1* | 5/2018 | Clendenning | | H01L 21/76861 |
| 2018/0350913 A1* | 12/2018 | Yang | | H01L 23/5226 |
| 2019/0181224 A1* | 6/2019 | Zhang | | H10D 64/017 |
| 2019/0267282 A1* | 8/2019 | Gstrein | | H01L 23/528 |
| 2020/0043777 A1* | 2/2020 | Kung | | H01L 21/7684 |
| 2020/0090988 A1* | 3/2020 | Peethala | | H01L 21/76846 |
| 2020/0098625 A1* | 3/2020 | Yin | | H01L 21/76895 |
| 2020/0135932 A1* | 4/2020 | Wang | | H10D 64/021 |
| 2021/0082750 A1* | 3/2021 | Yu | | H01L 23/535 |
| 2021/0111246 A1* | 4/2021 | Lie | | H10D 62/121 |
| 2021/0273114 A1* | 9/2021 | Chen | | H10D 30/031 |
| 2021/0408038 A1* | 12/2021 | Lin | | H10B 43/27 |
| 2021/0408046 A1* | 12/2021 | Chang | | G11C 11/2255 |
| 2022/0165848 A1* | 5/2022 | Lin | | H10D 64/017 |
| 2022/0319907 A1* | 10/2022 | Lee | | H01L 21/76224 |
| 2022/0367515 A1* | 11/2022 | Lu | | H10D 64/033 |
| 2022/0384258 A1* | 12/2022 | Breil | | H10D 30/6729 |
| 2022/0384459 A1* | 12/2022 | Lu | | G11C 11/223 |
| 2022/0406350 A1* | 12/2022 | Lin | | G11C 29/04 |
| 2022/0406900 A1* | 12/2022 | Wu | | H10D 62/118 |
| 2022/0416085 A1* | 12/2022 | Lu | | H10D 62/40 |
| 2023/0008239 A1* | 1/2023 | Chang | | H01L 21/76865 |
| 2023/0038021 A1* | 2/2023 | Lin | | H01L 23/5226 |
| 2023/0045420 A1* | 2/2023 | Wang | | H10B 51/40 |
| 2023/0061857 A1* | 3/2023 | Lin | | H10D 84/038 |
| 2023/0061921 A1* | 3/2023 | Shao | | H10B 12/315 |
| 2023/0063038 A1* | 3/2023 | Young | | H10B 51/20 |
| 2023/0063934 A1* | 3/2023 | Lin | | H10B 51/20 |
| 2023/0065891 A1* | 3/2023 | Ling | | H10D 30/0415 |
| 2023/0106816 A1* | 4/2023 | Lu | | H10B 51/20 |
| | | | | 257/295 |
| 2023/0121210 A1* | 4/2023 | Wang | | H10D 84/0186 |
| | | | | 257/774 |
| 2023/0187307 A1* | 6/2023 | Yu | | H01L 23/36 |
| | | | | 257/213 |
| 2023/0197522 A1* | 6/2023 | Chan | | H10D 30/43 |
| | | | | 438/284 |
| 2023/0238448 A1* | 7/2023 | Chien | | H10D 84/017 |
| | | | | 438/300 |
| 2023/0269931 A1* | 8/2023 | Lee | | H10D 30/6735 |
| | | | | 257/296 |
| 2023/0275024 A1* | 8/2023 | Chin | | H01L 21/76885 |
| 2023/0317848 A1* | 10/2023 | Chiang | | H10D 30/0415 |
| | | | | 257/295 |
| 2023/0328997 A1* | 10/2023 | Lu | | H10D 64/037 |
| | | | | 257/43 |
| 2023/0387022 A1* | 11/2023 | Tien | | H01L 21/76805 |
| 2023/0395504 A1* | 12/2023 | Chen | | H01L 21/76834 |
| 2023/0411291 A1* | 12/2023 | Liaw | | H01L 21/76895 |
| 2023/0420455 A1* | 12/2023 | Yu | | H10D 84/0149 |
| 2023/0420532 A1* | 12/2023 | Jhan | | H10D 30/6735 |
| 2024/0006417 A1* | 1/2024 | Liaw | | H10D 84/907 |
| 2024/0162321 A1* | 5/2024 | Chang | | H10D 62/364 |
| 2024/0332387 A1* | 10/2024 | Chiang | | H10D 84/0188 |
| 2024/0351026 A1* | 10/2024 | Ma | | B01D 19/00 |
| 2024/0404875 A1* | 12/2024 | Wang | | H10B 51/30 |
| 2025/0122611 A1* | 4/2025 | Lee | | H01L 21/02115 |
| 2025/0142832 A1* | 5/2025 | Wang | | H10B 51/40 |

* cited by examiner

GAP FILLING METHOD IN SEMICONDUCTOR MANUFACTURING PROCESS

BACKGROUND

As semiconductor devices are becoming more advanced, manufacturing processes thereof also experience many challenges. For example, promising and highly effective gap filling methods are required to avoid any formation of void or seam in a material that is intended to fill a gap, especially when the gap has a narrow critical dimension.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
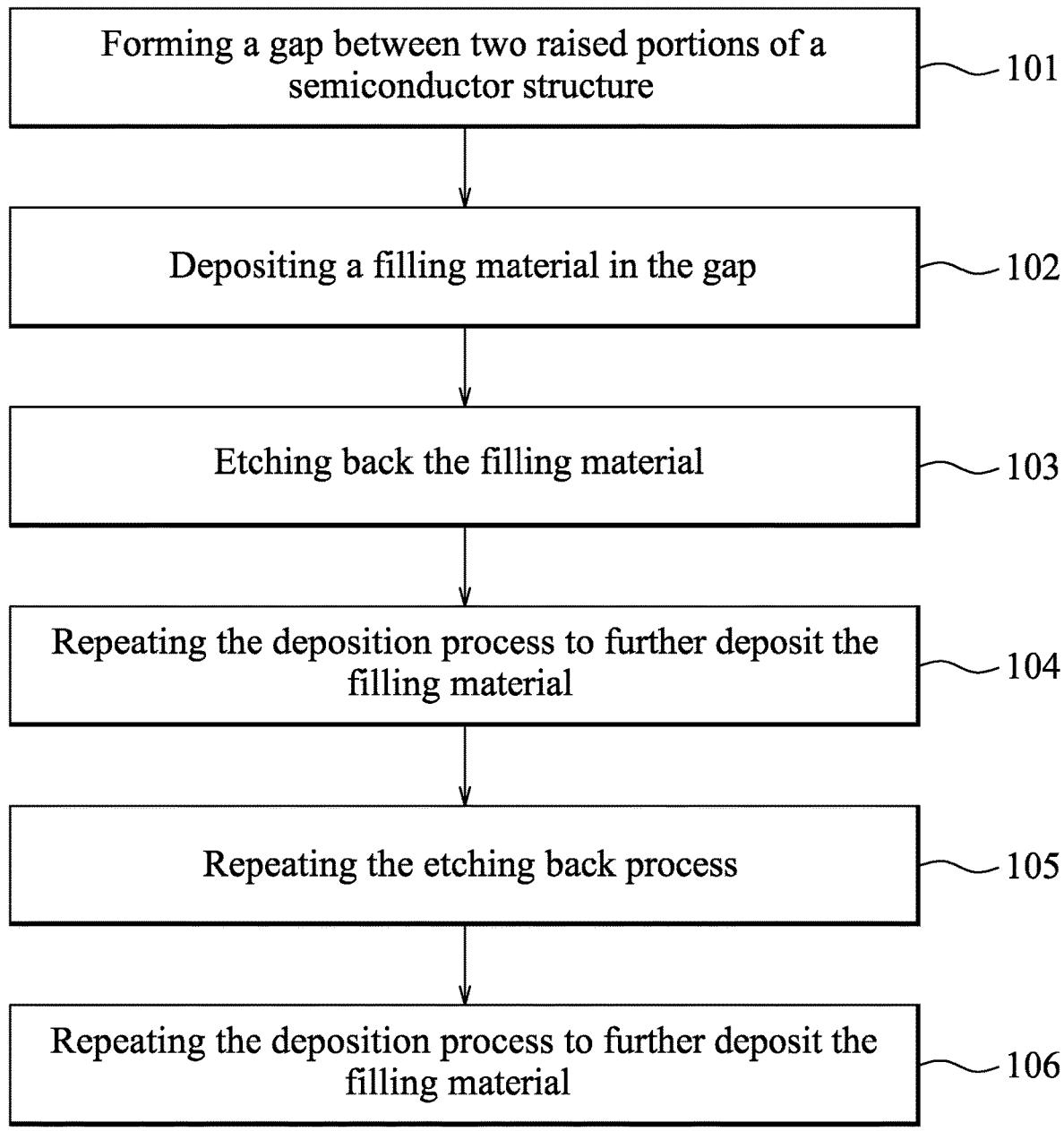
FIG. 1 is a flow diagram of a method for filling a gap in a semiconductor structure in accordance with some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "below," "upper," "lower," "uppermost," "lowermost," "bottommost," "inner," "outer," "lateral," "bottom," "upwardly" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to methods for filling a gap in a semiconductor structure with a filler element that is substantially free of void or seam. In different circumstances, for instance, for gaps having different ranges of aspect ratio, or when the filler element is formed using different deposition processes, the present disclosure provides different embodiments which achieve gap filling in a bottom-up manner that avoids the filler element being formed laterally. Such gap filling methods may be applied in, for example, but not limited to, front-end-of-line (FEOL) process such as self-aligned contact-metal gate (SAC-MG) replacement process, hybrid sheet structure formation, hybrid fin formation, or middle-end-of-line (MEOL) process such as gap filling process of contact via or metal-to-device (MD) contact, i.e., contact to conductive region of the semiconductor device such as a source or a drain. The semiconductor structure may be applied in, for example, but not limited to, a memory device, a multi-gate device, or other suitable devices. In some exemplary embodiments, the semiconductor structure is a gate-all-around (GAA) device. Examples of the filler element include, but are not limited to, titanium nitride, aluminum oxide, tungsten, ruthenium, molybdenum, hafnium oxide, or combinations thereof. Other materials suitable for forming the filler element are within the contemplated scope of the present disclosure.

FIG. 1 is a flow diagram illustrating a method 100 for filling a gap 10 in a semiconductor structure 1000 with a filler element 30 having a predetermined height (H) (see also FIG. 7) in accordance with some embodiments. In some embodiments, the method 100 is suitable for gaps having aspect ratio ranging from 1 to 3. Aspect ratio of a gap may be referred to a ratio of a depth (D) to a width (W) of the gap (see FIG. 2). In some embodiments, the depth (D) of the gap 10 ranges from about 25 nm to ab out 45 nm, and the width (W) of the gap 10 ranges from about 15 nm to about 30 nm. Other suitable dimensions of the depth (D) and the width (W) are within the contemplated scope of the present disclosure. FIGS. 2 to 7 illustrate schematic views of intermediate stages of the method 100. Some repeating structures are omitted in FIGS. 2 to 7 for the sake of brevity. Additional steps can be provided before, after or during the method, and some of the steps described herein may be replaced by other steps or be eliminated.

Figure 2:
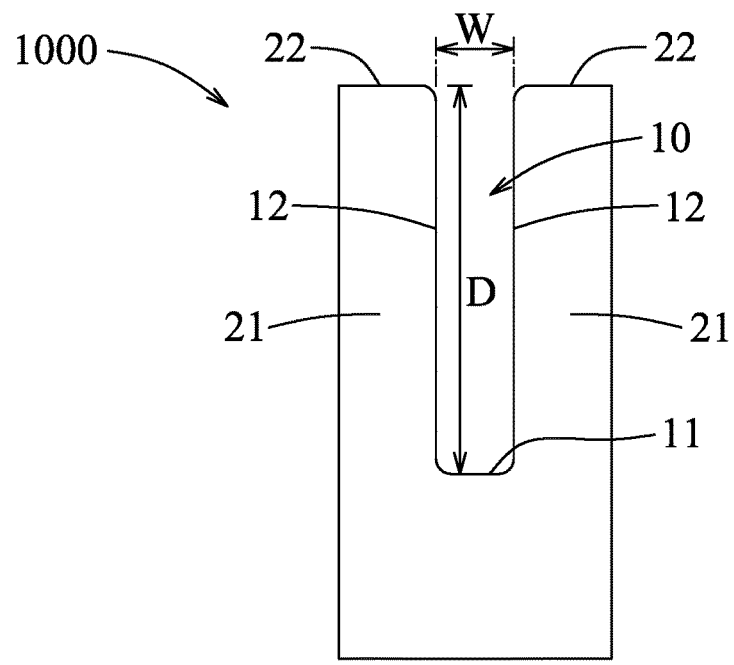
FIGS. 2 to 7 are schematic views illustrating intermediate stages of the method as depicted in FIG. 1 in accordance with some embodiments of the present disclosure.

Referring to FIG. 1 and the example illustrated in FIG. 2, the method 100 begins at step 101, where the gap 10 is formed between two raised portions 21 of the semiconductor structure 1000. The gap 10 has a bottom surface 11 and two lateral surfaces 12 each extending upwardly from the bottom surface 11 along one of the raised portions 21 to terminate at an upper surface 22 of a corresponding one of the raised portions 21.

Figure 3:
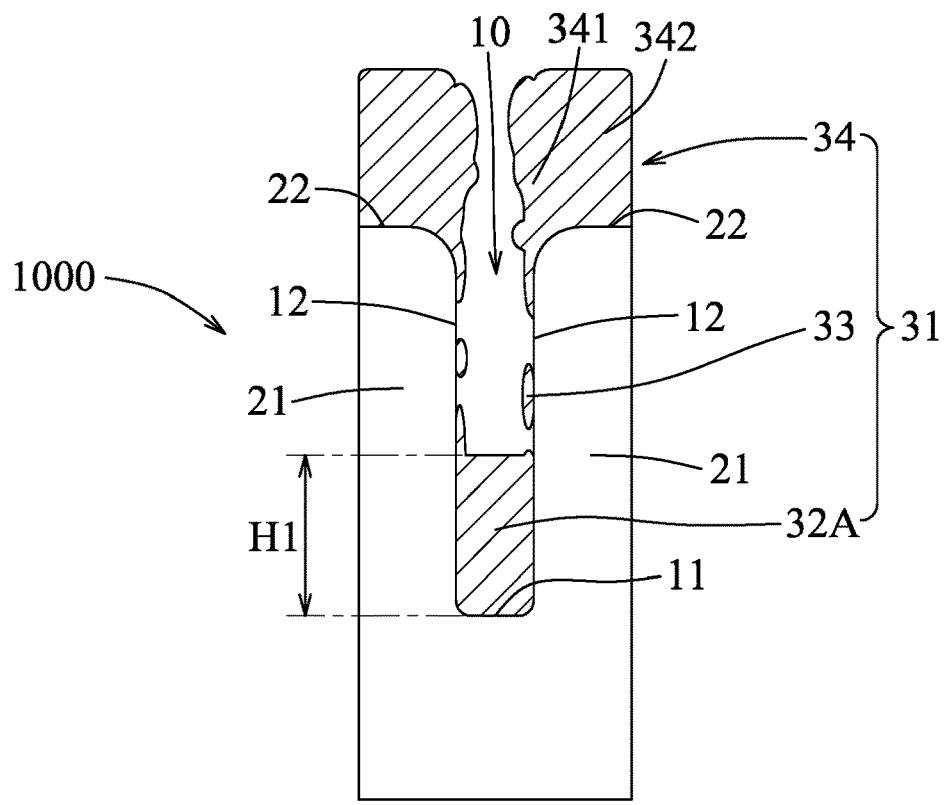

Referring to FIG. 1 and the example illustrated in FIG. 3, the method 100 proceeds to step 102, where a deposition process is performed to deposit a filling material 31 (which is to form the filler element 30 shown in FIG. 7) in the gap 10.

The filling material 31 has a first portion 32A on the bottom surface 11 of the gap 10, a second portion 33 on the lateral surfaces 12 of the gap 10, and a third portion 34 on the upper surfaces 22 of the raised portions 21. The third portion 34 includes an overhang part 341 which overhangs the gap 10, and a surrounding part 342 which surrounds the overhang part 341. Please note that although the first portion 32A and the third portion 34 shown in FIG. 3 have substantially the same thickness, the third portion 34 may have a thickness larger than the first portion 32A with the increasing of the aspect ratio of the gap 10.

When the deposition process is performed for a certain period of time, the overhang part 341 becomes an obstacle that hinders the filling material 31 from reaching the bottom of the gap 10, and thus impedes growth of the first portion 32A. In view of this, the deposition process stops when a height (H1) of the first portion 32A is no longer increased. In some embodiments, the height (H1) of the first portion 32A ranges from about 10 nm to about 20 nm. A ratio of the height (H1) of the first portion 32A to the depth (D) of the gap 10 (see also FIG. 2) may range from about 0.2 to about 0.6, depending on the aspect ratio of the gap 10.

The deposition process may be, for example but are not limited to, a physical vapour deposition (PVD) process, a chemical vapour deposition (CVD) process, or an atomic layered deposition (ALD) process. There is no limitation on type of deposition process used, and other suitable deposition processes for depositing the filling material 31 are within the contemplated scope of the present disclosure.

In some embodiments, when the filling material 31 is titanium nitride (TiN), a PVD process, such as sputtering, may be adopted using titanium target. In some embodiments, the sputtering process is conducted at a temperature ranging from about 350° C. to about 450° C. under a pressure of about 50 mTorr to about 500 mTorr in presence of argon. A power of about 0.5 kW to about 5 kW is used, and a voltage used may range from 0 kV to about 5 kV. In some other embodiments, a CVD process may also be adopted. A precursor including, for example but not limited to, titanium tetrachloride may be used in presence of hydrogen plasma. The CVD process may be conducted at a temperature ranging from about 400° C. to about 470° C. under a pressure of about 0.1 Torr to about 10 Torr. After PVD/CVD deposition of titanium, a nitridation process is performed so as to form titanium nitride. Other suitable materials and/or deposition processes and/or conditions for depositing titanium nitride are within the contemplated scope of the present disclosure.

In some embodiments, when the filling material 31 is tungsten (W), a PVD process, such as sputtering, may be adopted using tungsten target. In some embodiments, the sputtering process is conducted at a temperature ranging from about 10° C. to about 500° C. under a pressure of about 50 mTorr to about 500 mTorr. A voltage used may range from 0 kV to about 5 kV. In some other embodiments, a CVD process may also be adopted. A precursor including, for example but not limited to, tungsten hexafluoride ($WF_6$) and hydrogen may be used. The CVD process may be conducted at a temperature ranging from about 100° C. to about 400° C. under a pressure of about 0.1 Torr to about 20 Torr. Other suitable materials and/or deposition processes and/or conditions for depositing tungsten are within the contemplated scope of the present disclosure.

In some embodiments, when the filling material 31 is aluminum oxide ($AlO_x$), a PVD process, such as sputtering, may be adopted using aluminum target. In some embodiments, the sputtering process is conducted at a temperature ranging from about 500° C. to about 800° C. under a pressure of about 0.1 mTorr to about 100 mTorr in presence of an oxygen flow. A voltage used may range from 0 kV to about 5 kV. In some other embodiments, a CVD process may also be adopted. An aluminum complex precursor represented by $[AlH_2(O\text{-butyl})]_2$ may be used in the presence of oxygen plasma, but is not limited thereto. The CVD process may be conducted at a temperature ranging from about 50° C. to about 150° C. under a pressure of about 0.01 Torr to about 1 Torr with a power ranging from about 0.05 kW to about 1 kW. In some embodiments, after the CVD process, an annealing process is also performed. Other suitable materials and/or deposition processes and/or conditions for depositing aluminum oxide are within the contemplated scope of the present disclosure.

In some embodiments, when the filling material 31 is ruthenium (Ru), a PVD process, such as sputtering, may be adopted using ruthenium target. In some embodiments, the sputtering process is conducted at a temperature ranging from about 100° C. to about 200° C. under a pressure of about 1 mTorr to about 100 mTorr. A power of 0.05 kW to 1 kW is used, and a voltage used may range from 0 kV to about 5 kV. In some other embodiments, a CVD process may also be adopted. A precursor including, for example but not limited to, triruthenium dodecacarbonyl ($Ru_3(CO)_{12}$) may be used. The CVD process may be conducted at a temperature ranging from about 100° C. to about 200° C. under a pressure of about 1 mTorr to about 100 mTorr. Other suitable materials and/or deposition processes and/or conditions for depositing ruthenium are within the contemplated scope of the present disclosure.

In some embodiments, when the filling material 31 is molybdenum (Mo), a PVD process, such as sputtering, may be adopted using molybdenum target. In some embodiments, the sputtering process is conducted at a temperature ranging from about 300° C. to about 480° C. under a pressure of 0.5 Torr to about 10 Torr. A voltage used may range from 0 kV to about 5 kV. In some other embodiments, a CVD process may also be adopted. A precursor including, for example but not limited to, molybdenum(V) chloride ($MoCl_5$) or molybdenum hexacarbonyl $M(CO)_6$) may be used in the presence of hydrogen. The CVD process may be conducted at a temperature ranging from about 300° C. to about 480° C. under a pressure of about 0.1 Torr to about 150 Torr. Other suitable materials and/or deposition processes and/or conditions for depositing molybdenum are within the contemplated scope of the present disclosure.

Figure 4:
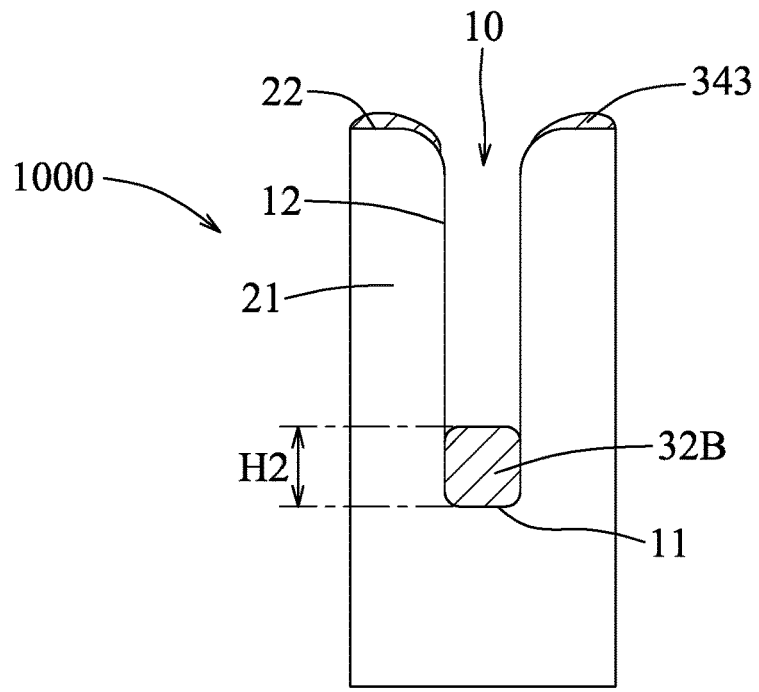

Referring to FIG. 1 and the examples illustrated in FIGS. 3 and 4, the method 100 proceeds to step 103, where an etching back process is performed to etch back the filling material 31 until the second portion 33 and the overhang part 341 of the third portion 34 are removed. Step 103 aims to remove mainly the second portion 33 and the overhang part 341 shown in FIG. 3, and to retain the first portion 32A as much as possible. In some embodiments, the surrounding part 342 of the third portion 34 is at least partially removed together with the overhang part 341. As shown in FIG. 4, after step 103, a residue of the surrounding part, denoted as 343, may be remained on the upper surfaces 22 of the raised portions 21. By performing the etching back process, the filling material 31 that is grown laterally can be removed, to thereby avoid the filler element 30 shown in FIG. 7 being formed laterally.

In some embodiments, the etching back process is for example, but not limited to, a wet etching process, which has no selectivity over the first, second and third portions 32, 33, 34. In order to minimize loss of the first portion 32A due to the etching back process, an etching rate of the filling material 31 in step 103 is controlled to be greater than 0 nm/min and not greater than 2 nm/min. After step 103, at least a portion of the first portion, denoted as 32B, is remained and has a height (H2). In some embodiments, the height (H2) of the first portion 32B ranges from about 4 nm to about 14 nm. In some embodiments, in step 103, an etching amount for the first portion 32A ranges from about 6 nm to about 10 nm.

The etching back process may be performed for a time period ranging from about 0.1 minute to about 10 minutes at a temperature ranging from about 25° C. to about 70° C. Depending on the content of the filling material that is to be etched, examples of wet etchants used may include an acid aqueous solution, a base aqueous solution, a hydrogen peroxide diluted aqueous solution, or an ozone aqueous solution. Other suitable wet etchants for etching back the filling material 31 are within the contemplated scope of the present disclosure.

Examples of the acid aqueous solution are an aqueous solution including hydrochloric acid (HCl) and hydrogen peroxide ($H_2O_2$), an orthoperiodic acid ($H_5IO_6$)-based chemical, or a (hypochlorous acid (HClO)-hypobromous acid (HBrO))-based chemical. Other suitable acid aqueous solutions are within the contemplated scope of the present disclosure. Examples of the base aqueous solution are an aqueous solution including ammonium hydroxide ($NH_4OH$) and hydrogen peroxide ($H_2O_2$), or an ammonium aqueous solution. Other suitable base aqueous solutions are within the contemplated scope of the present disclosure.

In some embodiments, when the filling material 31 is titanium nitride (TiN), the wet etchant may be a base aqueous solution, an acid aqueous solution, or a hydrogen peroxide diluted aqueous solution. In some embodiments, the base aqueous solution is an aqueous solution including $NH_4OH$ and $H_2O_2$, each of which is present in an amount ranging from about 1 wt % to about 10 wt % based on 100 wt % of the aqueous solution. In some embodiments, the acid aqueous solution is an aqueous solution including HCl and $H_2O_2$, each of which is present in an amount ranging from about 1 wt % to about 10 wt % based on 100 wt % of the aqueous solution. In some embodiments, based on 100 wt % of the hydrogen peroxide diluted aqueous solution, hydrogen peroxide is present in an amount ranging from about 1 wt % to about 10 wt %. Other suitable wet etchants for etching back titanium nitride (TiN) are within the contemplated scope of the present disclosure.

In some embodiments, when the filling material 31 is tungsten (W), the wet etchant may be a hydrogen peroxide diluted aqueous solution, or an ozone aqueous solution. In some embodiments, based on 100 wt % of the hydrogen peroxide diluted aqueous solution, hydrogen peroxide is present in an amount ranging from about 0.1 wt % to about 10 wt %. In some embodiments, based on 100 wt % of the ozone aqueous solution, ozone is present in an amount ranging from about 0.001 wt % (10 ppm) to about 0.01 wt % (100 ppm). Other suitable wet etchants for etching back tungsten (W) are within the contemplated scope of the present disclosure.

In some embodiments, when the filling material 31 is aluminum oxide ($AlO_x$), the wet etchant may be a base aqueous solution. In some embodiments, the base aqueous solution is an aqueous solution including $NH_4OH$ and $H_2O_2$, each of which is present in an amount ranging from about 0.1 wt % to about 10 wt % based on 100 wt % of the aqueous solution. In other embodiments, the base aqueous solution may also be an ammonium aqueous solution (i.e., $NH_4OH$ without $H_2O_2$,) and based on 100 wt % of the ammonium aqueous solution, $NH_4OH$ is present in an amount ranging from about 0.1 wt % to about 10 wt %. Other suitable wet etchants for etching back aluminium oxide ($AlO_x$) are within the contemplated scope of the present disclosure.

In some embodiments, when the filling material 31 is ruthenium (Ru), the wet etchant may be an acid aqueous solution. In some embodiments, the acid aqueous solution is an $H_5IO_6$-based chemical. Based on 100 wt % of the $H_5IO_6$-based chemical, $H_5IO_6$ is present in an amount ranging from about 0.1 wt % to about 10 wt %. In other embodiments, the acid aqueous solution is a HClO—HBrO-based chemical. Based on 100 wt % of the HClO—HBrO-based chemical, each of HClO and HBrO is present in an amount ranging from about 0.1 wt % to about 10 wt %. Other suitable wet etchants for etching back ruthenium (Ru) are within the contemplated scope of the present disclosure.

In some embodiments, when the filling material 31 is molybdenum (Mo), the wet etchant may be an ozone aqueous solution. In some embodiments, based on 100 wt % of the ozone aqueous solution, ozone is present in an amount ranging from about 0.001 wt % (10 ppm) to about 0.01 wt % (100 ppm). Other suitable wet etchants for etching back molybdenum (Mo) are within the contemplated scope of the present disclosure.

Please note that during the wet etching process, the temperature, the concentration of each chemical species in the wet etchant, and the etching time period may be varied to as to achieve a desired etching rate of the filling material 31.

Removal of the second portion 33 is conducive to avoid formation of voids and/or seams, if any, formed between the second portion 33 and the first portion 32A in step 102. In addition, by removing the overhang part 341, the etching back process allows an obstacle-free passage for other elements to access an interior of the gap 10, or more specifically, a top surface of the filling material 31 that is already deposited in the gap 10 (i.e., the first portion 32B), and facilitates further deposition of the filling material 31 onto the first portion 32B. Subsequently, the deposition process (step 102) and the etching back process (step 103) are repeated, so that a height of the filling material 31 deposited on the bottom surface 11 of the gap 10 gradually increases, and eventually achieving the predetermined height (H, see also FIG. 7). In this exemplary embodiment, there are three deposition processes (step 102, as well as step 104 and step 106 that are performed subsequently) and two etching back processes (step 103, and also step 105 that is performed subsequently), but are not limited thereto.

Figure 5:
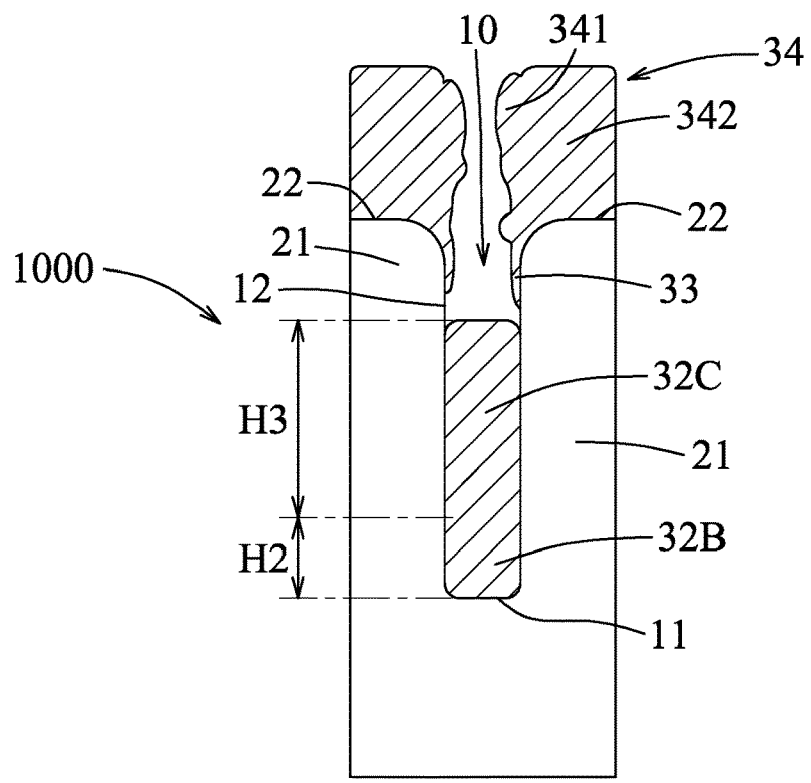

Referring to FIG. 1 and the example illustrated in FIG. 5, the method 100 proceeds to step 104, where the deposition process of step 102 is repeated to further deposit the filling material 31 in the gap 10 of the semiconductor structure shown in FIG. 4. Similar to the deposition process of step 102, the first portion, denoted as 32C, is formed on top of the remaining portion of the first portion 32B obtained in step 103. Besides, the second portion 33 is formed on the lateral surfaces 12 of the gap 10, and the third portion 34 (also including the overhang part 341 and surrounding part 342) is formed on the upper surfaces 22 of the raised portions 21. The deposition process stops when a height (H3) of the first portion 32C is no longer increased. In some embodiments, a sum of the height (H3) of the first portion 32C and the height (H2) of the first portion 32B ranges from about 20 nm to about 30 nm. In some embodiments, a ratio of the sum of the height (H3) and the height (H2) to the height (H1) of the first portion 32A may range from about 1.2 to about 2. Conditions of the deposition process in step 104 are similar to that of the step 102, and are not described for the sake of brevity.

Figure 6:
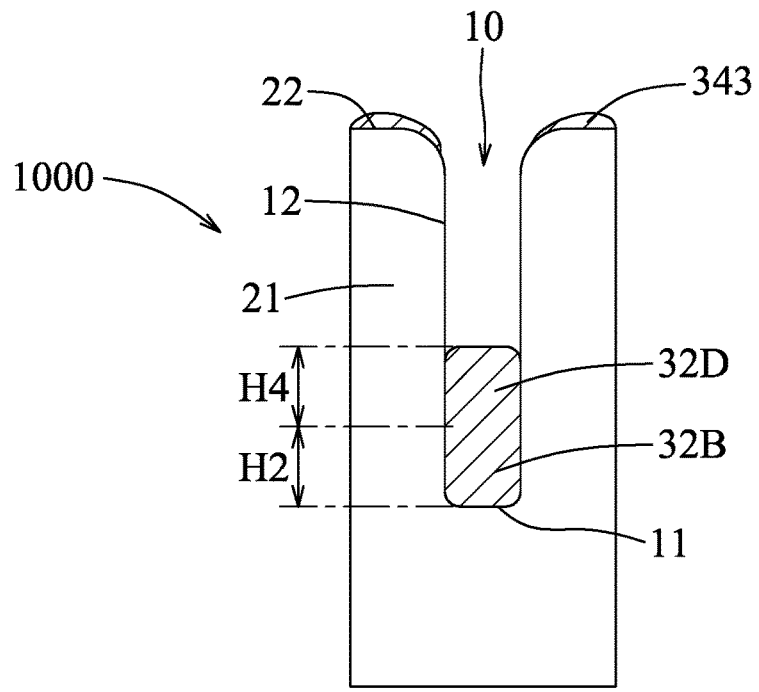

Referring to FIG. 1 and the examples illustrated in FIGS. 5 and 6, the method 100 proceeds to step 105, where the etching back process of step 103 is repeated to etch back the filling material 31 until the second portion 33 and the overhang part 341 of the third portion 34 formed in step 104 are removed. Similar to step 103, step 105 also aims to remove mainly the second portion 33 and the overhang part 341, and to retain the first portion 32C as much as possible, and thus in the etching back process, the etching rate of the filling material 31 is also controlled to be greater than 0 nm/min and not greater than 2 nm/min. In some embodiments, in step 105, the surrounding part 342 of the third portion 34 is at least partially removed together with the overhang part 341. A residue of the surrounding part, denoted as 343, may be remained on the upper surfaces 22 of the raised portions 21. After step 105, at least a portion of the first portion deposited in step 104, denoted as 32D is remained and has a height (H4). In some embodiments, a sum of the height (H4) of the first portion 32D and the height (H2) of the first portion 32B ranges from about 14 nm to about 24 nm. Conditions of the etching back process in step 105 are similar to that of the step 103, and are not described for the sake of brevity.

Figure 7:
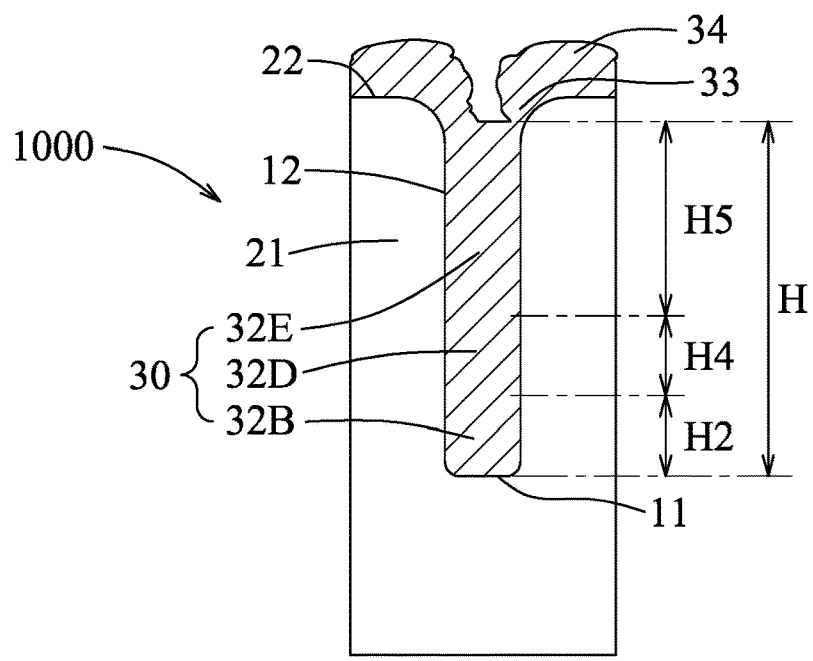

Referring to FIG. 1 and the example illustrated in FIG. 7, the method 100 proceeds to step 106, where the deposition process of step 102 is repeated to further deposit the filling material 31 in the gap 10 of the semiconductor structure shown in FIG. 6. Similar to the deposition process of step 102 and step 104, the first portion, denoted as 32E, is formed on top of the remaining portion of the first portion 32D obtained in step 105 to have a height (H5). Conditions of the deposition process in step 106 are similar to that of the step 102, and are not described for the sake of brevity. Please note that the first portion 32E in FIG. 7 is for illustrating purpose and is shown in an exaggerated size relative to the first portions 32B, 32D and the third portion 34. In some other embodiments, the first portion 32E shown in FIG. 7 may be obtained through repeating the deposition process of step 102 and the etching back process of step 103.

In this exemplary embodiment, after step 106, which is the third time of the deposition process, the filling material 31 deposited on the bottom surface 11 of the gap 10, (i.e., the first portion 32B obtained in step 103, the first portion 32D obtained in step 105 and the first portion 32E obtained in step 106) has achieved the predetermined height (H) of the filler element 30, thereby obtaining the filler element 30. In some embodiments, the structure 1000 shown in FIG. 7, in which the filler element 30 is formed, may be further subjected to a removing process, for example, but not limited to, a chemical mechanical polishing (CMP) process or other suitable techniques, so as to remove an excess part of the filling material 31, such as the second portion 33 and the third portion 34 that are also formed during step 106. In the case that the sum of heights (H2, H4, and H5) is greater than the predetermined height (H) of the filler element 30, an etching process similar to that of the etching back process described in step 103 and step 105 may be used as the removing process to remove the second portion 33 and the third portion 34 and to reduce the height of the first portion 32E.

In the method 100, during formation of the filler element 30, a series of deposition processes along with etching back processes (to remove any filling material 31 that is formed laterally, i.e., the second portion 33 and the overhang part 341 of the third portion 34) are performed, so as to avoid lateral formation of filler element 30, thereby preventing formation of seams or voids in the filler element 30. The method 100 may effectively fill gaps that have relatively low aspect ratio, e.g., ranging from 1 to 3.

Figure 8:
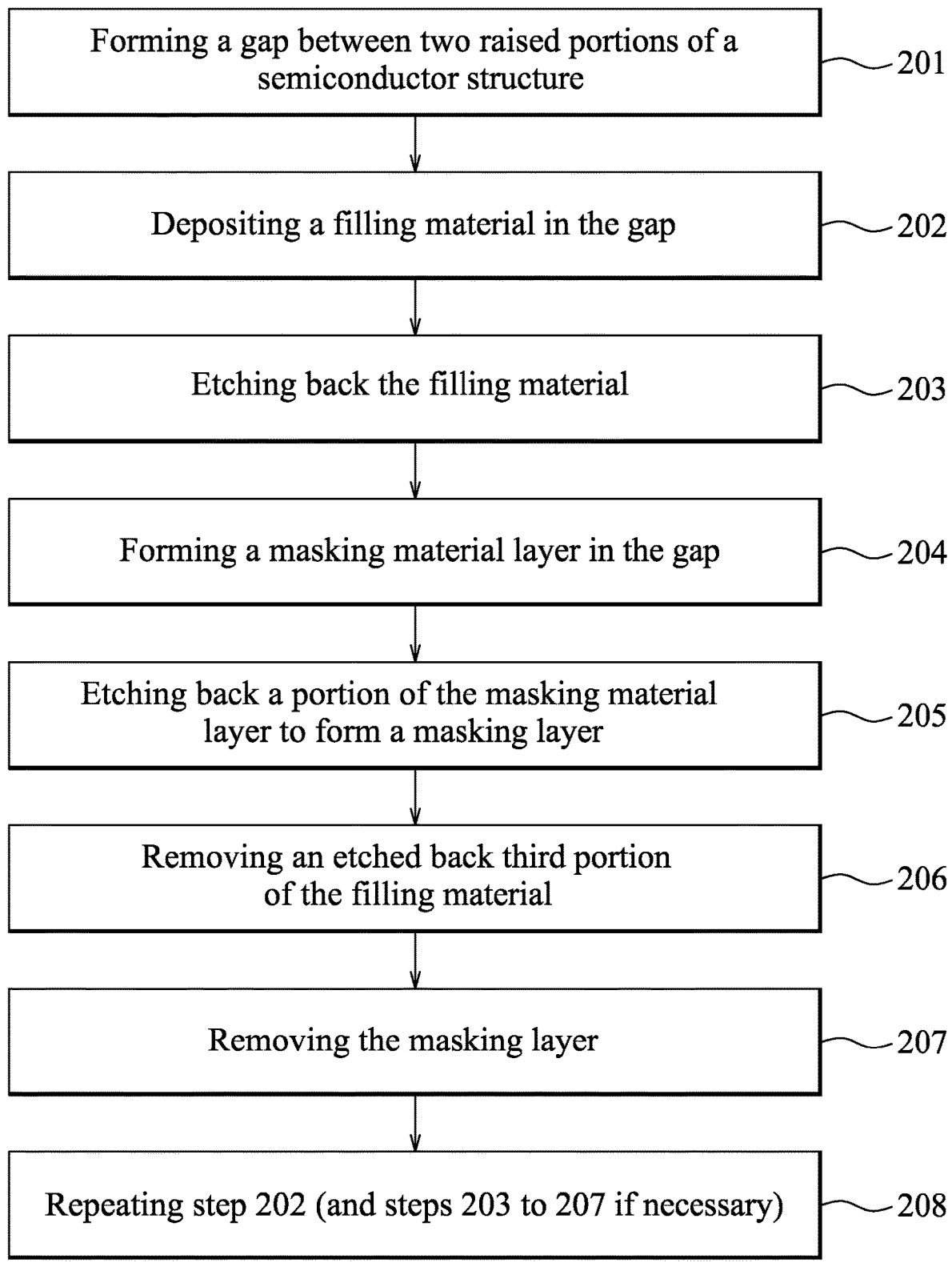
FIG. 8 is a flow diagram of another method for filling a gap in a semiconductor structure in accordance with some embodiments of the present disclosure.

FIG. 8 is a flow diagram illustrating the method 200 for filling a gap 10 in a semiconductor structure 2000 with a filler element 30 having a predetermined height (H) (see also FIG. 17) in accordance with some embodiments. In some embodiment, the method 200 is suitable for gaps 10 having aspect ratio ranging from about 3 to about 10. In other embodiments, the gap 10 has the aspect ratio ranging from about 8 to about 10. In some embodiments, the depth (D) of the gap 10 ranges from about 150 nm to about 250 nm, and the width (W) of the gap 10 ranges from about 15 nm to about 30 nm (see also FIG. 9). Other suitable dimensions of the depth (D) and the width (W) are within the contemplated scope of the present disclosure. FIGS. 9 to 17 illustrate schematic views of intermediate stages of the method 200. Some repeating structures are omitted in FIGS. 9 to 17 for the sake of brevity. Additional steps can be provided before, after or during the method, and some of the steps described herein may be replaced by other steps or be eliminated.

Figure 9:
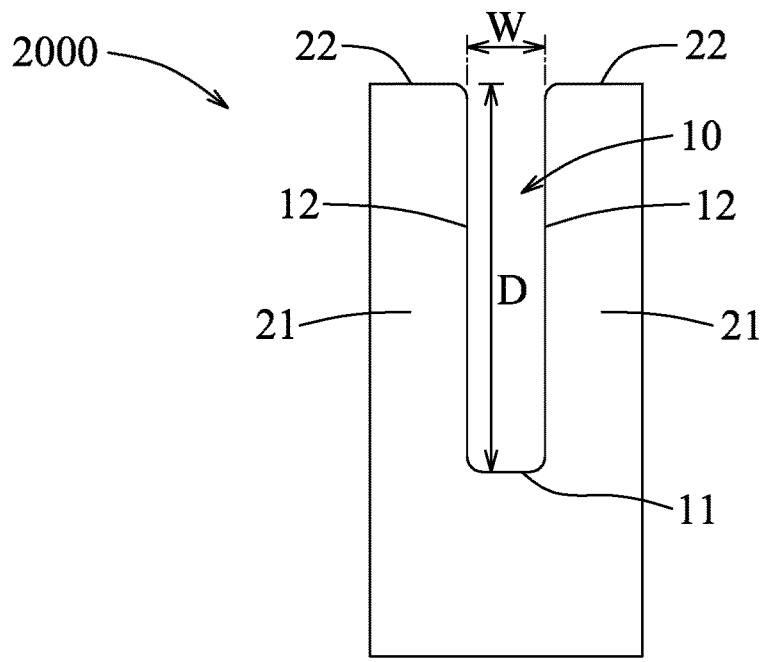
FIGS. 9 to 17 are schematic views illustrating intermediate stages of the method as depicted in FIG. 8 in accordance with some embodiments of the present disclosure.

Referring to FIG. 8 and the example illustrated in FIG. 9, the method 200 begins at step 201, where the gap 10 is formed between two raised portions 21 of the semiconductor structure 2000. Please note that the figures of the present disclosure, especially, FIGS. 2-7, 9-17, 19 and 22-27, are not drawn to scale, and the gap 10 shown in FIG. 9 is similar to but may have an aspect ratio greater than that of the gap 10 shown in FIG. 2.

Figure 10:
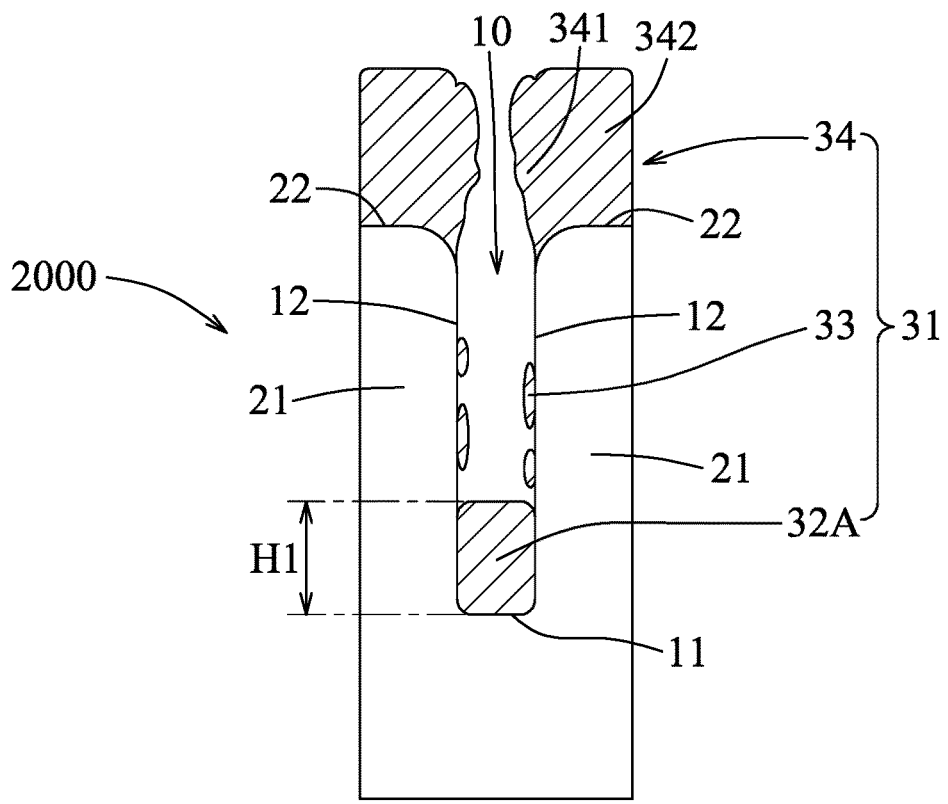

Referring to FIG. 8 and the example illustrated in FIG. 10, the method 200 proceeds to step 202, where a deposition process is performed to deposit a filling material 31 (which is to form the filler element 30 shown in FIG. 17) in the gap 10. Since step 202 is similar to step 102 of the method 100, details of step 202 are therefore omitted for the sake of brevity. After step 202, similar to step 102, the filling material 31 has a first portion 32A on the bottom surface 11 of the gap 10, a second portion 33 on the lateral surfaces 12 of the gap 10, and a third portion 34 on the upper surfaces 22 of the raised portions 21. In some embodiments, the first portion 32A has a height (H1) ranging from about 5 nm to about 15 nm. In some embodiments, in the case that the aspect ratio of the gap 10 ranging from about 8 to about 10, a ratio of the height (H1) of the first portion 32A to the depth (D) of the gap 10 ranges from about 0.01 to about 0.1 (see also FIG. 9), and the third portion 34 has a thickness greater than that of the first portion 32A.

Figure 11:
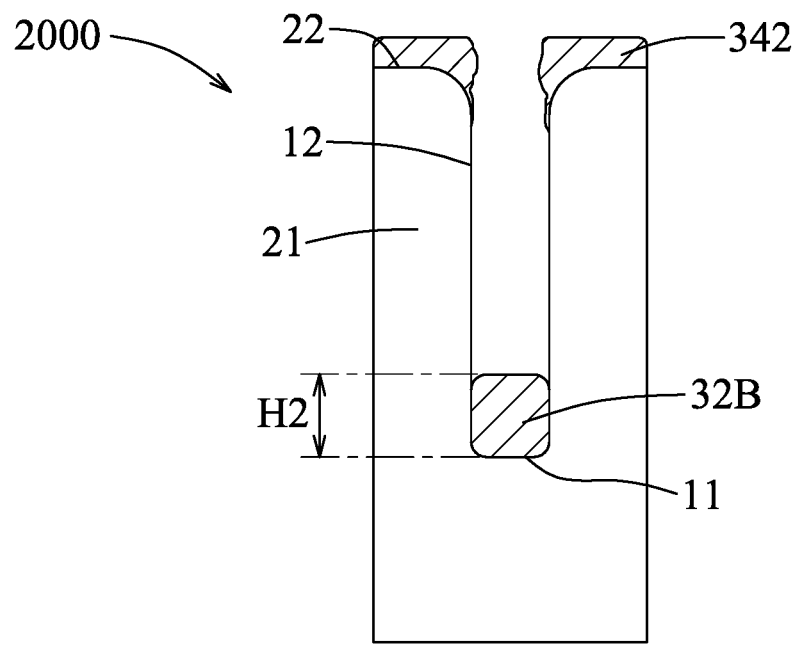

Referring to FIG. 8 and the example illustrated in FIG. 11, the method 200 proceeds to step 203, where an etching back process is performed to etch back the filling material 31 until the second portion 33 is removed. Step 203 aims to remove mainly the second portion 33, and to retain the first portion 32A as much as possible, though an overhang part 341 of the third portion 34 may also be removed along with the removal of the second portion 33, leaving a surrounding part 342 on the upper surfaces 22 of the raised portions 21.

The etching back process may be a wet etching process, and an etching rate of the filling material 31 is controlled to be greater than 0 nm/min and not greater than 2 nm/min, so as to minimize loss of the first portion 32A during etching back of the second portion 33. Depending on the filler material 31 deposited in step 202, wet etchants used in the etching back process of step 203, may be similar to those of step 103 of the method 100, and thus details of step 203 are omitted for the sake of brevity. In some embodiments, parameters of the etching back process of step 203 may be adjusted, such that the loss ratio of the first portion 32A in step 203 is controlled to be even less than the loss ratio of the first portion 32A in step 103 of method 100. As such, after step 203, at least a portion of the first portion, denoted as 32B, is remained and has a height (H2) which is slightly less than or substantially the same as the height (H1) of the first portion 32A prior to the etching back process (see also FIG. 10). In some embodiments, the first portion 32B has a height (H2) greater than 0 nm and not greater than about 10 nm. In some embodiments, in step 203, an etching amount of the first portion 32A shown in FIG. 10 may ranges from 0 nm to about 5 nm.

Figure 12:
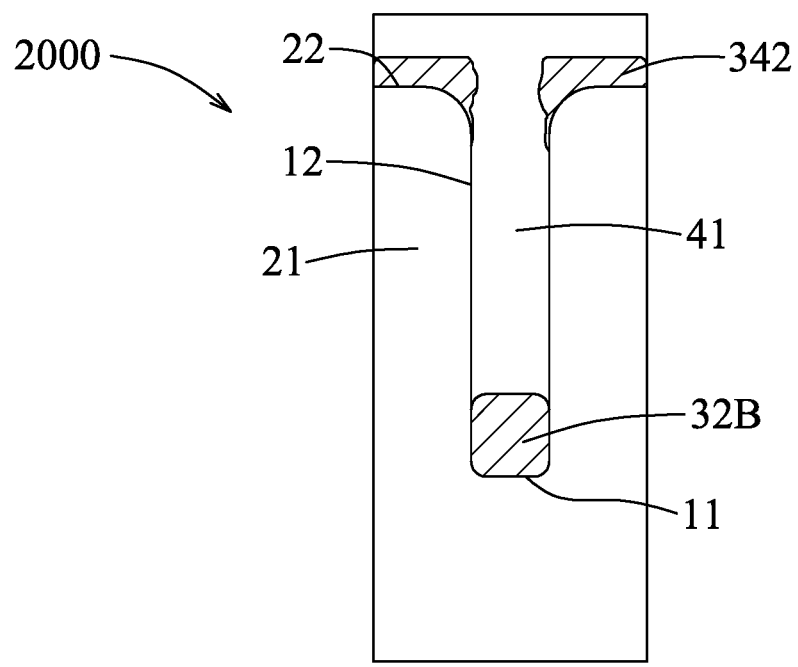

Referring to FIG. 8 and the example illustrated in FIG. 12, the method 200 proceeds to step 204, where a masking material layer 41 is filled in the gap 10 to cover the etched back first portion 32B and the etched back third portion, i.e., the surrounding part 342.

In some embodiments, the masking material layer 41 (which is to form a masking layer 40 in step 205 that is performed subsequently) includes, for example, but not limited to a bottom anti-reflective coating (BARC). In some embodiments, the BARC is a polymer prepared from 4-vinylphenol monomers (to form polyvinylphenol polymer) or styrene monomers (to form polystyrene polymer). Other suitable materials for forming the masking material layer 41 are within the contemplated scope of the present disclosure.

In some embodiments, the masking material layer 41 is formed by sub-steps of: (i) spin coating the monomers over the structure shown in FIG. 11 at a temperature ranging from about 10° C. to about 35° C., (ii) performing a baking process at a temperature ranging from about 150° C. to about 450° C., so that the monomers polymerize to thereby form the masking material layer 41.

Figure 13:
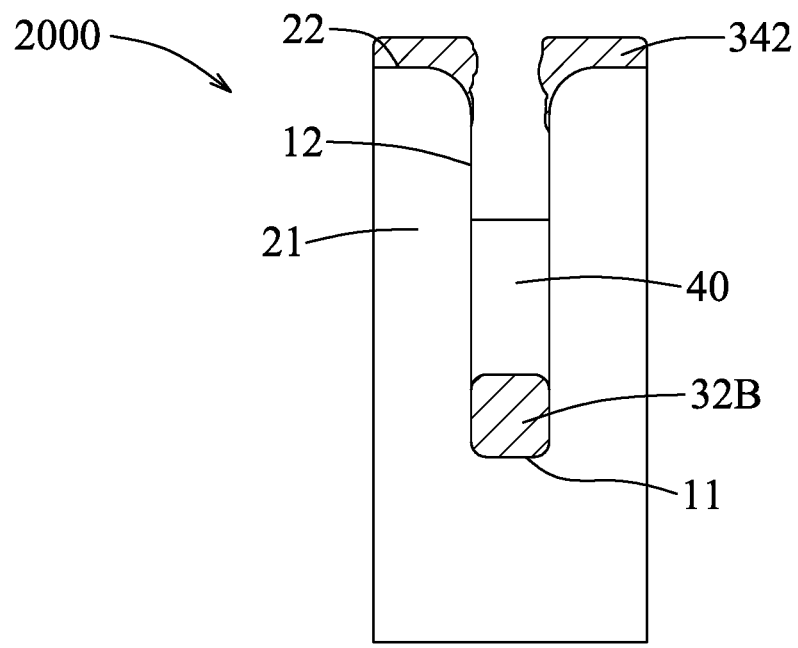
Figure 14:
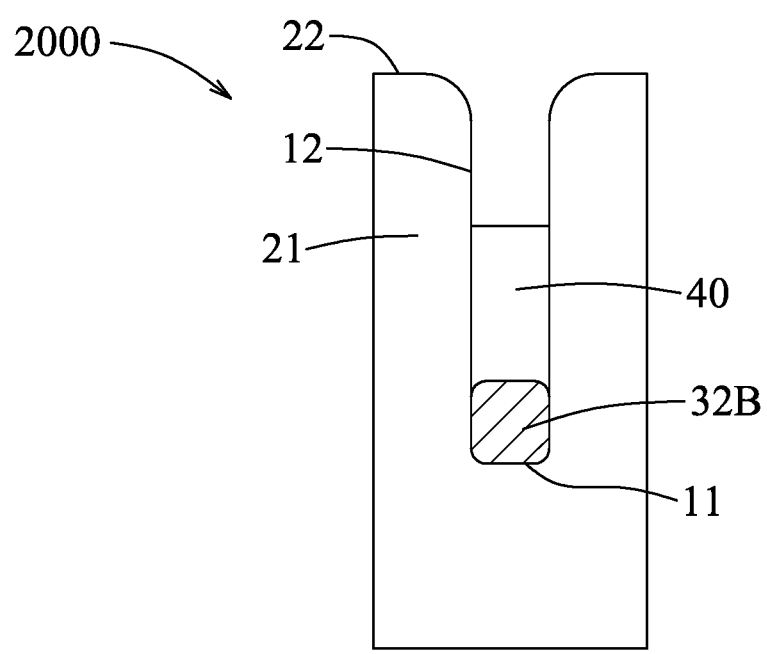

Referring to FIG. 8 and the example illustrated in FIG. 13, the method 200 proceeds to step 205, where an etching back process is performed to etch back a portion of the masking material layer 41, thereby forming the masking layer 40, and the etched back third portion 34, i.e., the surrounding part 342, is exposed from the masking layer 40.

The etching process selectively removes the masking material layer 41, and substantially has no effect on other components shown in FIG. 12. In some embodiments, the etching process is performed using a plasma generated from a gas mixture including nitrogen, hydrogen, argon and methane at a temperature ranging from about 10° C. to about 100° C. under a power ranging from about 50 W to about 500 W.

The masking layer 40 is formed to protect the first portion 32B from damage during removal of the surrounding part 342 in step 207 that is performed subsequently. In some embodiments, the masking layer 40 has a height ranging from about 30 nm to about 70 nm. A top surface of the masking layer 40 may be spaced apart from the upper surfaces 22 of the raised portions 21 by a distance ranging from about 120 nm to about 160 nm. When the depth (D) of the gap 10 (see also FIG. 9) is X, the height of the masking layer 40 may range from 0.2X to 0.3X, Referring to FIG. 8 and the example illustrated in FIG. 14, the method 200 proceeds to step 206, where a first removing process is performed to remove the etched back third portion 34, i.e., the surrounding part 342.

In some embodiments, the first removing process is, for example, but not limited to, a wet etching process. A wet etchant used in the wet etching process is compatible with the material of the masking layer 40 so that the masking layer 40 may remain substantially intact to protect the first portion 32B from damage due to the wet etchant. That is, the wet etching process selectively removes the third portion 34 and substantially does not affect the masking layer 40 or other components shown in FIG. 13. The wet etching process may be performed for a time period ranging from about 0.1 minutes to about 10 minutes at a temperature ranging from about 25° C. to about 70° C. Depending on the content of the third portion 34 that is to be etched, examples of the wet etchants used may include an acid aqueous solution, a base aqueous solution, a hydrogen peroxide diluted aqueous solution, or an ozone aqueous solution. Other suitable wet etchants for removing the third portion 34 are within the contemplated scope of the present disclosure.

Examples of the acid aqueous solution are an aqueous solution including HCl and $H_2O_2$ described in step 103 of the method 100. Other suitable acid aqueous solution are within the contemplated scope of the present disclosure. Examples of the base aqueous solution are an aqueous solution including $NH_4OH$ and $H_2O_2$, or the ammonium aqueous solution described in step 103 of the method 100. Please note that when the aqueous solution including $NH_4OH$ and $H_2O_2$ is used, the temperature, the etching time period and the concentration of each components in the aqueous solution may be different from those described in step 103 and step 203, so as to ensure that the wet etchant can be compatible with the BARC during removal of the third portion 34. For example, wet etchants similar to those described above may be used in step 206 at a relatively lower temperature so as to prevent destruction of the BARC (i.e., a loss of the BARC) during removal of the third portion 34. Other suitable base aqueous solutions are within the contemplated scope of the present disclosure.

In some embodiments, when the third portion 34 is made of titanium nitride (TiN), the aqueous solution including HCl and $H_2O_2$, and the hydrogen peroxide diluted aqueous solution used in step 103 of method 100 and step 203 are also applicable in this step, as the etchants are compatible with the BARC, though parameters of the wet etching process might be varied to achieve a desired etching rate.

In some embodiments, when the third portion 34 is made of tungsten (W), the hydrogen peroxide diluted aqueous solution used in step 103 of method 100 and step 203 are also applicable in this step, as the etchants are compatible with the BARC, though parameters of the wet etching process might be varied to achieve a desired etching rate. In addition, the wet etchant may also be an acid aqueous solution, which is an aqueous solution including hydrochloric acid (HCl) and hydrogen peroxide ($H_2O_2$), each of which is present in an amount ranging from about 0.1 wt % to about 10 wt % based on 100 wt % of the aqueous solution.

In some embodiments, when the third portion 34 is made of aluminum oxide ($AlO_x$), the ammonium aqueous solution used in step 103 of method 100 and step 203 are also applicable in this step, as the etchants are compatible with the BARC, though parameters of the wet etching process might be varied to achieve a desired etching rate.

In some embodiments, when the third portion 34 is made of molybdenum (Mo), the wet etchant is a hydrogen peroxide diluted aqueous solution, and hydrogen peroxide is present in an amount ranging from about 0.1 wt % to about 10 wt % based on 100 wt % of the hydrogen peroxide diluted aqueous solution. In other embodiments, the wet etchant is an acid aqueous solution which is an aqueous solution including HCl and $H_2O_2$, each of which is present in an amount ranging from about 1 wt % to about 10 wt % based on 100 wt % of the aqueous solution.

Please note that, when the filling material 31 deposited in step 202 is ruthenium (Ru), wet etchants commonly used for Ru, such as $H_5IO_6$, HClO, or cerium ammonium nitrate (CAN), are strong oxidizers that are not compatible with the BARC, and thus method 200 is unlikely to be employed for deposition of Ru.

Figure 15:
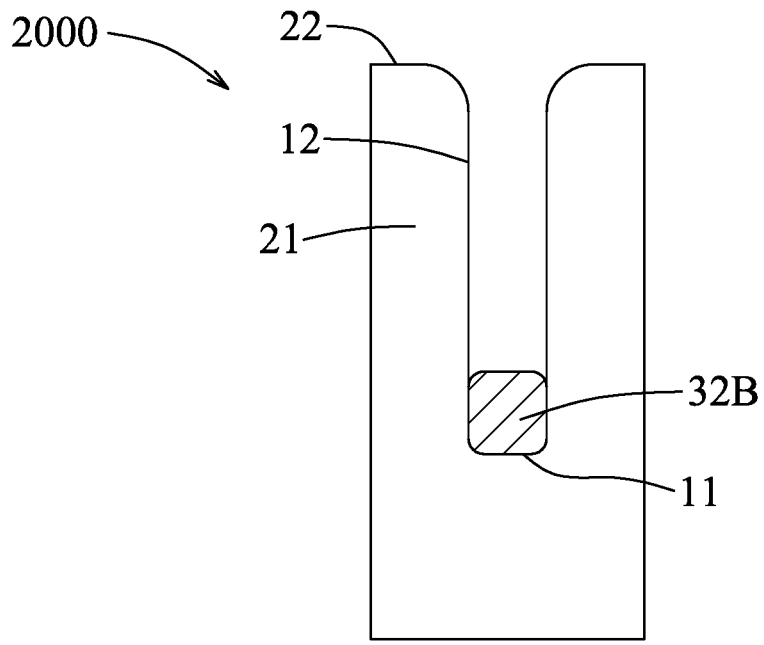

Referring to FIG. 8 and the example illustrated in FIG. 15, the method 200 proceeds to step 207, where a second removing process is performed to remove the masking layer 40. In some embodiments, the second removing process is an ashing process performed at a relatively high temperature to vaporize the masking layer 40. In other embodiments, the second removing process may be an etching process similar to that of step 205.

Steps 203 to 207 aim to remove the second portion 33 and the third portion 34 in a stepwise manner without excess loss of the first portion 32A, and to remove voids and/or seams, if any, formed between the second portion 33 and the first portion 32A in step 202. Since the height (H2) of the first portion 32B retained may not yet reach the desired predetermined height (H) of the filler element 30 (see also FIG. 17), the deposition process (step 202), the etching back process (step 203), the formation of the masking layer (step 204 followed by step 205), the first removing process (step 206) and the second removing process (step 207) are repeated in such order, until the filling material 31 on the bottom surface 11 of the gap 10 has the predetermined height (H), thereby obtaining the filler element 30.

Figure 16:
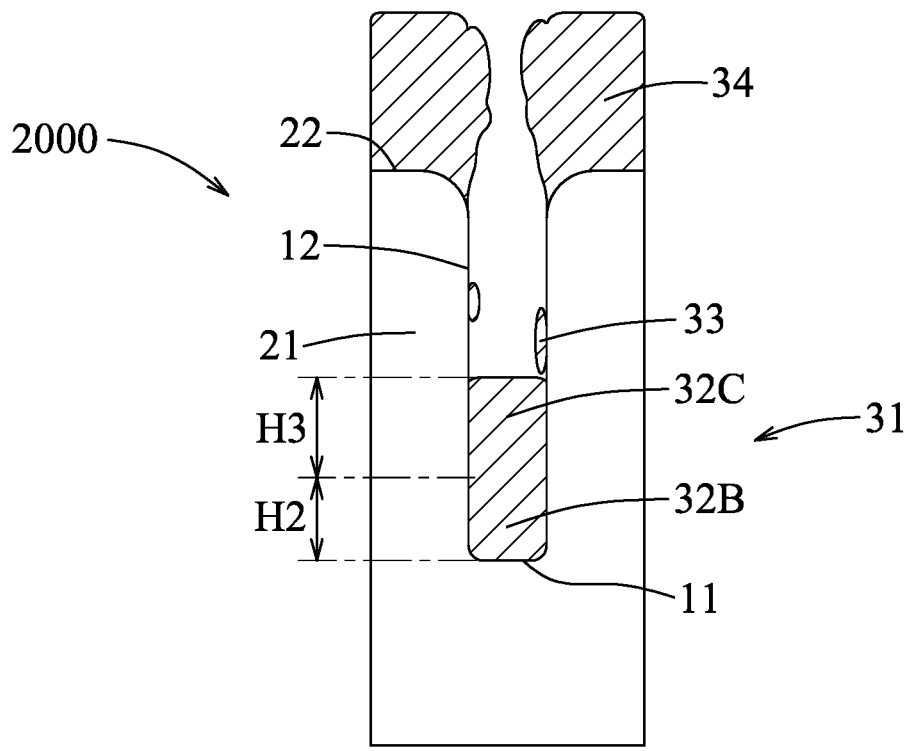

Referring to FIG. 8 and the example illustrated in FIG. 16, the method 200 proceeds to step 208, where the deposition process in step 202 is repeated to further deposit the filling material 31 in the gap 10. Since step 209 is similar to step 202, details of step 209 is therefore omitted for the sake of brevity. After step 209, a first portion 32C is formed on top of the first portion 32B retained after step 208, and the second portion 33 and the third portion 34 are also formed. In some embodiments, a sum of a height (H3) of the first portion 32C and the height (H2) of the first portion 32B ranges from about 15 nm to about 25 nm. The sum of the height (H3) and the height (H2) may be 1.5 to 3 times larger than the height (H2).

Figure 17:
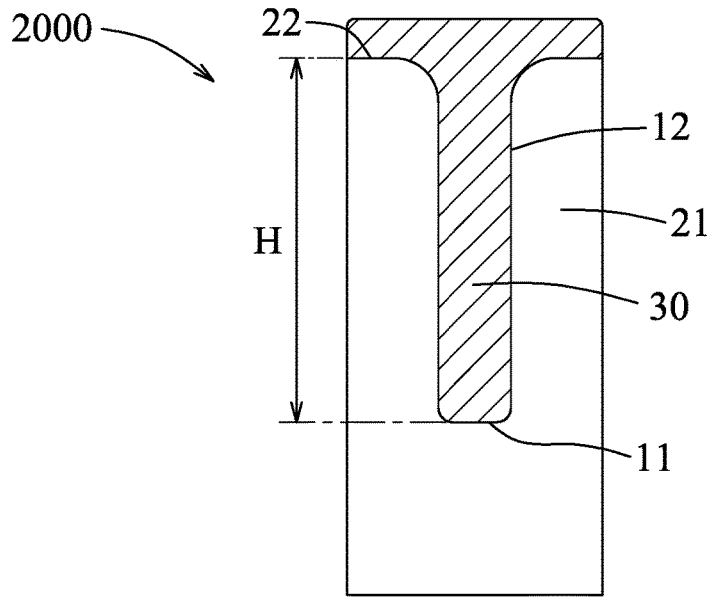

The other steps that are to be repeated are not described for the sake of brevity. FIG. 17 illustrates the intermediate step at which the filling material 31 deposited on the bottom surface 11 has a height not less than the predetermined height (H), and the filler element 30 is thereby obtained (in FIG. 17). In some embodiments, the structure 2000 shown in FIG. 17, in which the filler element 30 is formed, may be further subjected to a removing process, for example, but not limited to, a CMP process or other suitable techniques, so as to remove an excess part of the filling material 31, such as the second portion 33 and the third portion 34. In the case that the total height of the filling material 31 at the bottom of the gap 10 is greater than the predetermined height (H) of the filler element 30, an etching process similar to that of the etching back process described in step 203 may be used to remove the second portion 33 and the third portion 34 and to reduce the height of the filling material 31 at the bottom of the gap 10 to the predetermined height (H).

In the method 200, during formation of the filler element 30, a series of deposition processes along with etching processes that remove any filling material 31 formed laterally, i.e., the second portion 33 and the overhang part 341 of the third portion 34, are performed, so as to avoid lateral formation of the filler element 30, thereby preventing formation of seams or voids in the filler element 30. During removal of the filling material 31 that is formed laterally, the filling material 31 at the bottom of the gap 10, i.e. the first portion 32B, is well protected by the masking layer 40 (see FIG. 13), so as to minimize loss of the first portion 32B. In other words, in the method 200, the employment of the masking layer 40 allows gaps that have relatively high aspect ratio, e.g., ranging from 3 to 30, to be filled efficiently.

Figure 18:
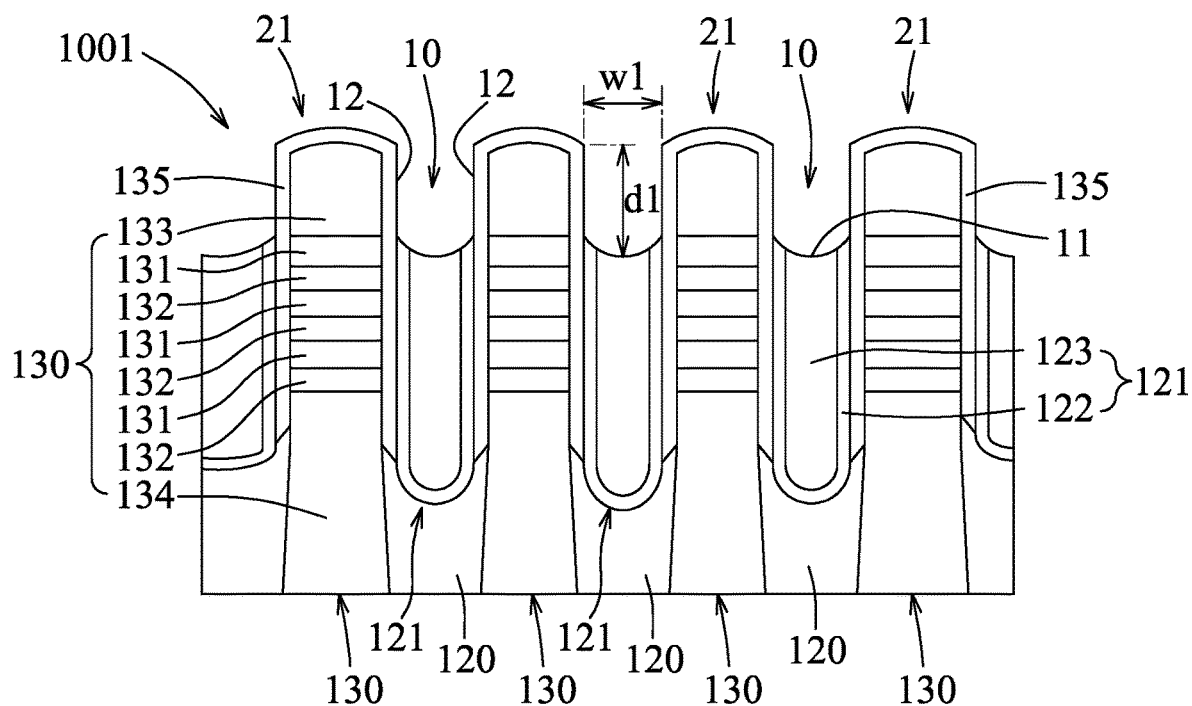
FIGS. 18 to 20 are schematic views illustrating intermediate stages of the method as depicted in FIG. 1 or 8 in accordance with some embodiments of the present disclosure.
Figure 20:
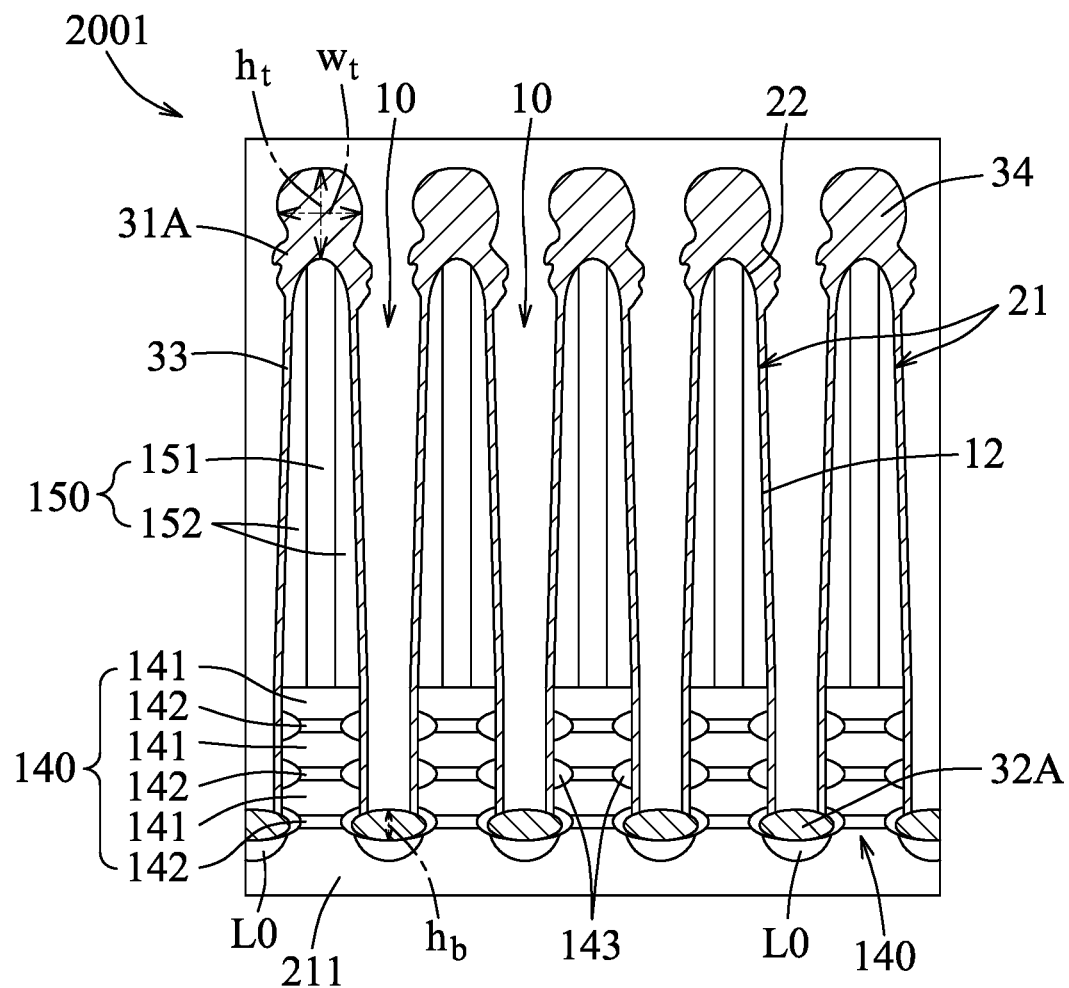

The following paragraphs provide different exemplary applications of the abovementioned method 100 and method 200 in manufacturing of different semiconductor structures, for example, but not limited to, a gate-all-around (GAA) nanosheet structure. Other suitable applications of the methods 100 and 200 are within the contemplated scope of the present disclosure. FIGS. 18, to 20 provide two different examples of gap filling involved in manufacturing of GAA nanosheet structure.

FIG. 18 illustrates a schematic view of an intermediate stage of a GAA nanosheet structure 1001 in accordance with some embodiments. Gaps 10 shown in FIG. 18 are provided for filling a high dielectric constant (high-k) material (which is to form high-k material layers (not shown) each corresponding to the filler element 30 shown in FIG. 7). The high-k material is, for example, but not limited to titanium nitride (TiN), hafnium oxide ($HfO_x$), or other suitable materials, to form a high dielectric constant material layer. Each of the gaps 10 has a width (w1) and a depth (d1), an aspect ratio of each of the gaps 10 is found to range from about 2 to about 3. In such case, method 100 is applied to fill the gaps 10 with the high-k material, and no voids or seams are found in the high-k material layer formed thereby. After forming the high-k material layers, each of the high-k material layers and a dielectric portion 121 therebeneath can serve as a hybrid fin for separating source/drain portions (not shown) formed thereafter. The source/drain portions may refer to a source or a drain, individually or collectively dependent upon the context.

The GAA nanosheet structure 1001 includes a semiconductor substrate (not shown), a plurality of shallow trench isolation (STI) portions 120 disposed on the semiconductor substrate, and a plurality of raised portions 21 which are formed on the semiconductor substrate to alternate with the STI portions 120. The semiconductor substrate may include, for example, silicon or other suitable materials. The STI portions 120 may include, for example, silicon oxide or other suable materials. A plurality of gaps 10 are each formed between two adjacent raised portions 21, the gap 10 has a bottom surface 11 and two lateral surfaces 12 each extending upwardly from the bottom surface 10 along one of the raised portions 21 to terminate at an upper surface 22 of a corresponding one of the raised portions 21. Each of the raised portions 21 includes a stack 130 which has a plurality of channel layers 131, a plurality of sacrificial layers 132 disposed to alternate with the channel layers 131, a hard mask 133 disposed on the channel layers 131 and the sacrificial layers 132, and a lower portion 134 disposed beneath the channel layers 133 and the sacrificial layers 132. The channel layers 131 may include, for example, silicon, but not limited thereto. The sacrificial layers 132 may include, for example, silicon germanium, but not limited thereto. The hard mask 133 may include, for example, silicon nitride, but not limited thereto. The lower portion 134 extends upwardly from the semiconductor substrate and may include a semiconductor material the same as or different from the material of the semiconductor substrate. Each of the raised portions 21 may also include a sacrificial liner 135 formed to cover the stack 130. The GAA nanosheet structure 1001 further includes a plurality of the dielectric portions 121 formed respectively on the STI portions 120. Each of the dielectric portions 121 is formed between two adjacent ones of the raised portions 21 and has an upper surface which serves as the bottom surface 11 of a corresponding one of the gaps 10. The dielectric portions 121 each includes a dielectric film 122 and a dielectric body 123. Each of the lateral surfaces 12 of the gaps 10 extends from the upper surface of one of the dielectric portions 121 along a side surface of the sacrificial liner 136 of a corresponding one of the raised portions 21 to terminate at an upper surface of the sacrificial liner 136 of the corresponding raised portion 21. The dielectric film 122 may include, for example, a silicon-based dielectric material such as silicon oxide, silicon nitride, silicon oxycarbide, or other suitable materials. The dielectric body 123 may include a material different from that of the dielectric film 122, for example, an oxide material such as silicon oxide, or other suitable materials.

Figure 19:
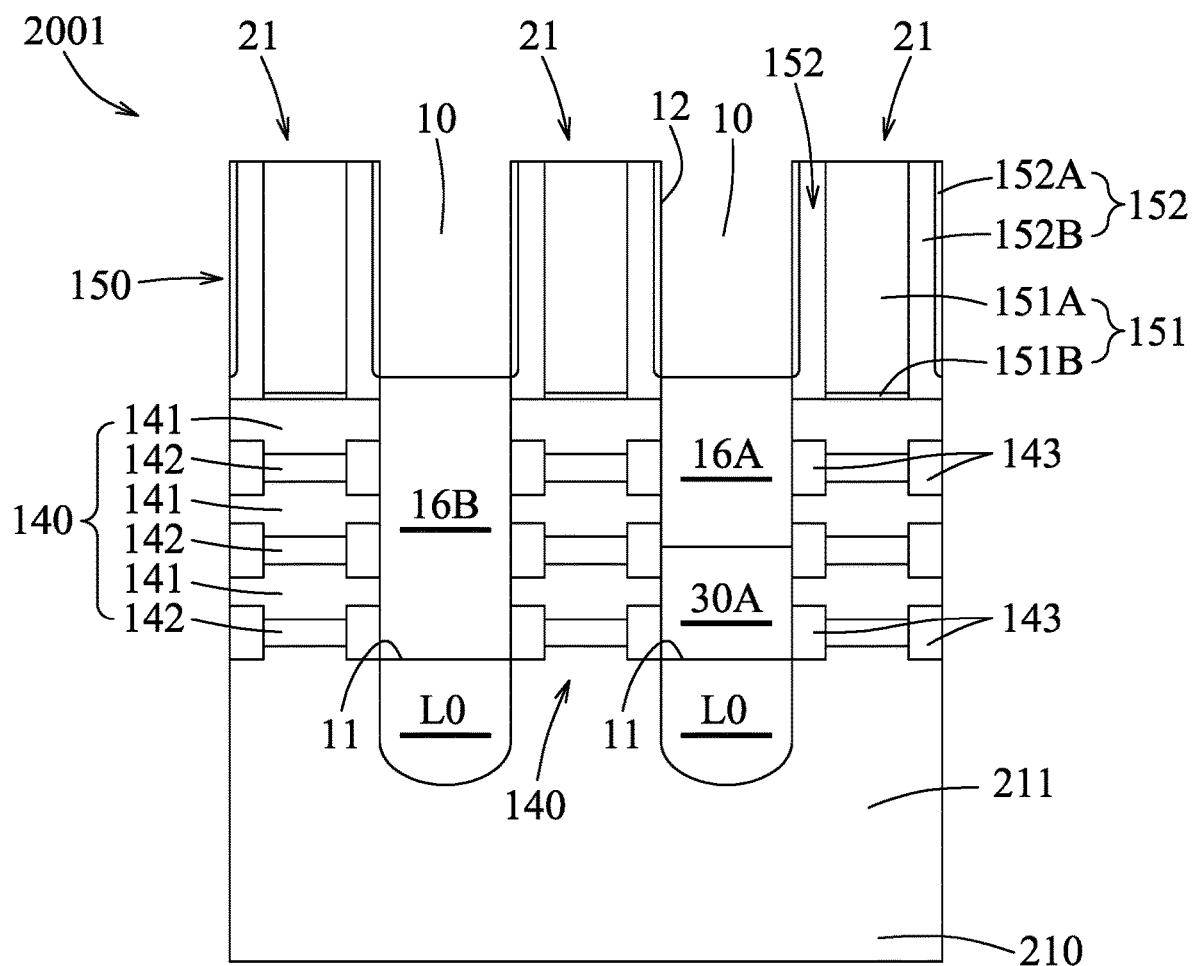

FIG. 19 illustrates a schematic view of an intermediate stage of a GAA nanosheet structure 2001 in accordance with some embodiments. The GAA nanosheet structure 2001 includes a semiconductor substrate 210, a plurality of raised portions 21 which are separated from each other and which are formed on the semiconductor substrate 210, a semiconductor portion 211 which is formed to interconnect each of the raised portions 21 to the semiconductor substrate 210, and a plurality of gaps 10 each of which is formed between two adjacent ones of the raised portions 21. The semiconductor substrate 210 may include, for example, silicon or other suitable materials and the semiconductor portion 211 may include a semiconductor material the same or different from that of the semiconductor substrate 210. A surface of the semiconductor portion 210, which is exposed from two adjacent ones of the raised portions 21, serves as the bottom surface 11 of a corresponding one of the gaps 10. In some embodiments, a plurality of epitaxial layers (L0) each of which is formed in the semiconductor portion 211 between two adjacent ones of the raised portions 21 to serve as a part of the semiconductor portion 211 and to serve as the bottom surface 11 of the corresponding gap 10. Each of the epitaxial layers (L0) may include, for example, silicon or other suitable materials. Each of the raised portions 21 includes a stack 140 which has a plurality of channel layers 141 and a plurality of sacrificial layers 142 disposed to alternate with the channel layers 141. Each of the sacrificial layers 142 has two inner spacers 143 at two opposite sides thereof so as to prevent the sacrificial layers 142 from being accessed through a corresponding one of the gaps 10. The materials for the channel layers 141 and the sacrificial layers 142 may be similar to the channel layers 131 and the sacrificial layers 132 of the GAA nanosheet structure 1001, respectively. The inner spacers 143 may each include silicon oxide, silicon nitride, silicon oxynitride, high dielectric constant materials, other suitable materials, or combinations thereof. In addition, each of the raised portions 21 further includes an upper segment 150 on the stack 140. The upper segment 150 includes a dummy gate part 151 and two gate spacers 152 disposed at two opposite sides of the dummy gate part 151. The dummy gate part 151 may include a dummy gate 151A and a dummy gate dielectric 151B. The dummy gate 151A may include, for example, polycrystalline silicon, microcrystal silicon, amorphous silicon, or other suitable materials. The dummy gate dielectric 151B may include, for example, silicon oxide or other suitable materials. The gate spacers 152 may each a single layer or multiple layers 152A, 152B and may include, for example, but not limited to, a silicon carbon-containing dielectric material, a silicon oxide-containing material, silicon nitride, other suitable materials, or combinations thereof.

As shown in FIG. 19, the GAA nanosheet structure 2001 includes three raised portions 21 (hereinafter referred to as left, middle, and right raised portions) and two gaps 10 (hereinafter referred to as left and right gaps). In addition, a filler element 30A is formed in the right gap 10, a first source/drain portion 16A is formed on the filler element 30A in the right gap 10, and a second source/drain portion 16B is formed in the left gap 10. The filler elements 30A may include any suitable materials. The first and second source/drain portions 16A, 16B may refer to a source or a drain, individually or collectively dependent upon the context, and may each independently include an epitaxial semiconductor material (e.g., silicon, silicon germanium or other suitable materials) doped with n-type or p-type dopant(s). The first source/drain portion 16A is disposed to interconnect two sheets of the channel layers 141 of the middle raised portions 21 with two sheets of the channel layers 141 of the right raised portion 21 while the second source/drain portion 16B is disposed to interconnect three sheets of the channel layers 141 of the left raised portion 21 with three sheets of the channel layers 141 of the middle raised portion 21. In this case, the GAA nanosheet structure 2001 may be referred to as a hybrid sheet configuration. The filler element 30A is formed into some of the gaps 10 (for example, the right gap 10) prior to forming the first and second source/drain portions 16A, 16B. Other suitable materials for the elements of the GAA nanosheet structure 2001 are within the contemplated scope of the present disclosure.

FIG. 20 illustrates schematic view of another intermediate stage of the GAA nanosheet structure 2001 in accordance with some embodiments. In FIG. 20, each of the gaps 10 has a high aspect ratio, such as ranging from about 7 to 9, and a filling material 31A for forming the filler element 30A shown in FIG. 19 is deposited over the nanosheet structure 2001. The filling material 31A includes a first portion 32A on each of the epitaxial layers (L0) in the semiconductor portion 211, a second portion 33 on side surfaces of the stacks 140 and the upper segments 150 of the raised portions 21, and a third portion 34 on the upper segments 150 of the raised portions 21.

In a one-time deposition process as shown in FIG. 20, increment of a thickness ($h_t$) of the third portion 34 of the filling material 31A is found to be much greater than an increment of a thickness ($h_b$) of the first portion 32A of the filling material 31A because the third portion 34 (having a width of $w_t$) overhangs the gaps 10, and undesirably hinders the filling material 31A from reaching the bottom of the gaps 10. In such case, method 200 is applied to fill the gaps 10, so as to effectively form the filler element 30A, as well as the first and second source/drain portions 16A, 16B. Thereafter, steps 203 to 207 of the method 200 are repeated in such order until the filling material 31A on the bottom surfaces 11 of the gaps 10 shields a bottommost one of the channel layers 141 of each of the raised portions 21, thereby obtaining a plurality of the filler elements 30A (see FIG. 19) respectively in the gaps 10.

Formation of the filler element 30A and the first and second source/drain portions 16A, 16B shown in FIG. 19 may be performed by sub-steps of: (i) forming a mask (not shown) covering the gaps 10 that are intended to form the filler element 30A shown in FIG. 19 therein, while exposing the gaps 10 that are not intended to form the filler element 30A therein; (ii) removing the filler element(s) 30A exposed from the mask; (iii) removing the mask; and (iv) filling the epitaxial semiconductor material into the gaps 10 to obtain the first and second source/drain portions 16A, 16B.

Figure 21:
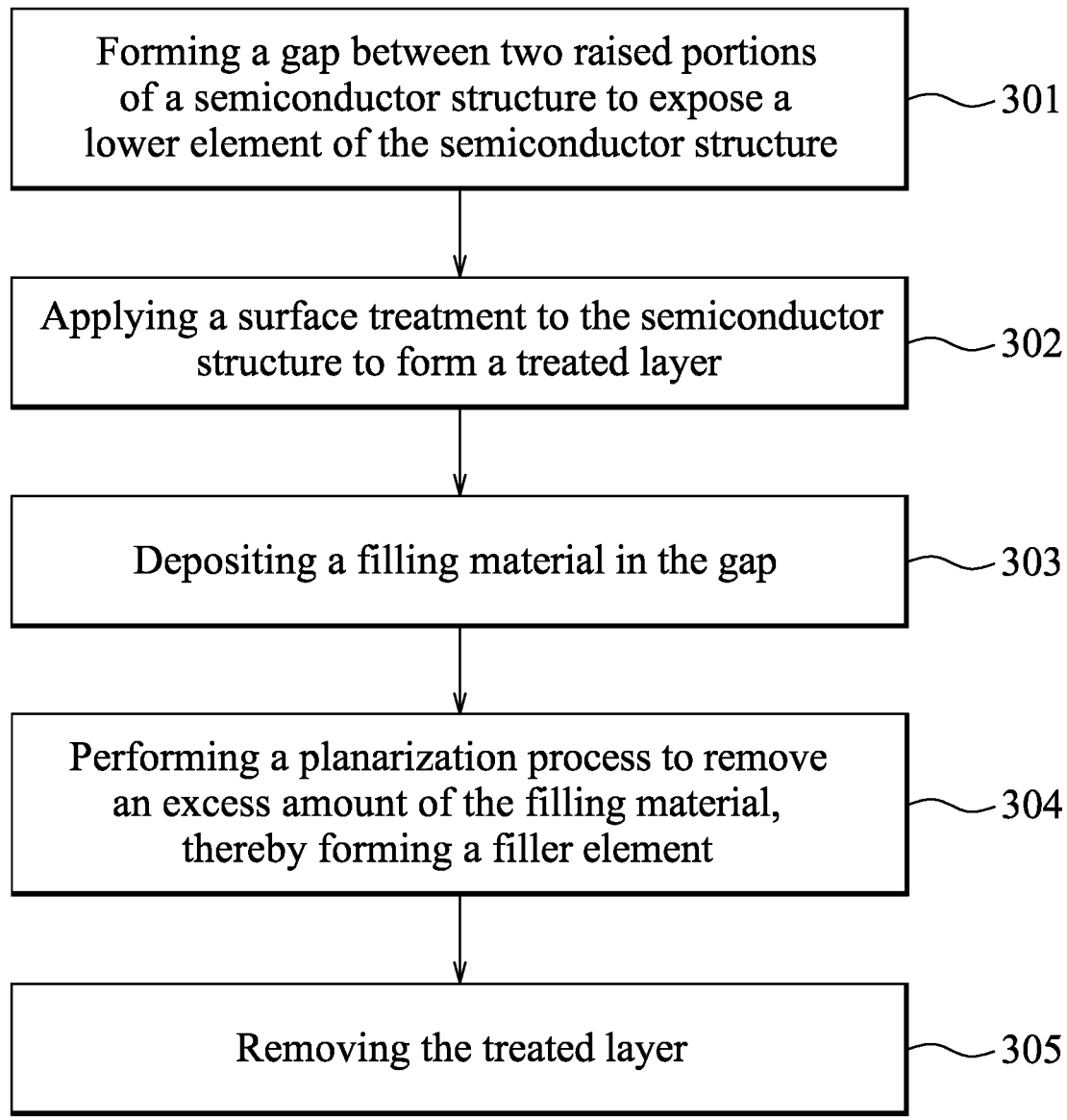
FIG. 21 is a flow diagram of yet another method for filling a gap in a semiconductor structure in accordance with some embodiments of the present disclosure.

FIG. 21 is a flow diagram illustrating a method 300 for filling a gap 10 in a semiconductor structure 3000 with a filler element 30 in accordance with some embodiments. In the method 300, the filler element 30 is selectively formed in the gap 10 using any suitable deposition processes that show selectivity over surfaces having different hydrophilicity such that the filler element 30 is not formed laterally. FIGS. 22 to 27 illustrate schematic views of intermediate stages of the method 300. Some repeating structures are omitted in FIGS. 22 to 27 for the sake of brevity. Additional steps can be provided before, after or during the method, and some of the steps described herein may be replaced by other steps or be eliminated.

Figure 22:
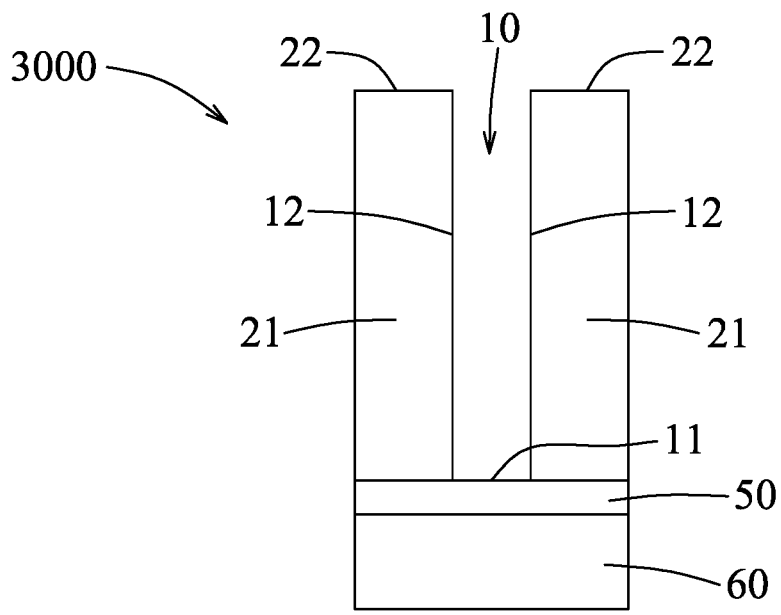
FIGS. 22 to 27 are schematic views illustrating intermediate stages of the method as depicted in FIG. 21 in accordance with some embodiments of the present disclosure.

Referring to FIG. 21 and the example illustrated in FIG. 22, the method 300 begins at step 301, where a gap 10 is formed between two raised portions 21 of the semiconductor structure 3000 to expose a lower element 50 of the semiconductor structure 3000. The lower element 50 is made of a material different from that of the raised portions 21. In some embodiments, the lower element 50 includes, a metallic material for example, but not limited to, fluorine-free tungsten, ruthenium, titanium nitride, or other suitable materials. In some embodiments, the raised portions 21 each independently includes, for example, but not limited to, silicon oxide, silicon nitride, silicon carbide, silicon oxynitride, or combinations thereof. Raised portions 21 made of these materials may have a surface that is rich in electron-donating groups, e.g., —OH group (commonly observed on silicon oxide material), or —NH$_2$ group (on silicon nitride). Other suitable materials for forming the lower element 50 and/or the raised portion 21 are within the contemplated scope of the present disclosure. In some embodiments, the lower elements 50 is a capping layer disposed on a work function metal 60 of a metal gate. The work function metal 60 may be made of titanium nitride or other suitable materials. The gap 10 has a bottom surface 11 on the lower element 50 and two lateral surfaces 12 each extending upwardly from the bottom surface 11 along one of the raised portions 21 to terminate at an upper surface 22 of a corresponding one of the raised portions 21.

Figure 23:
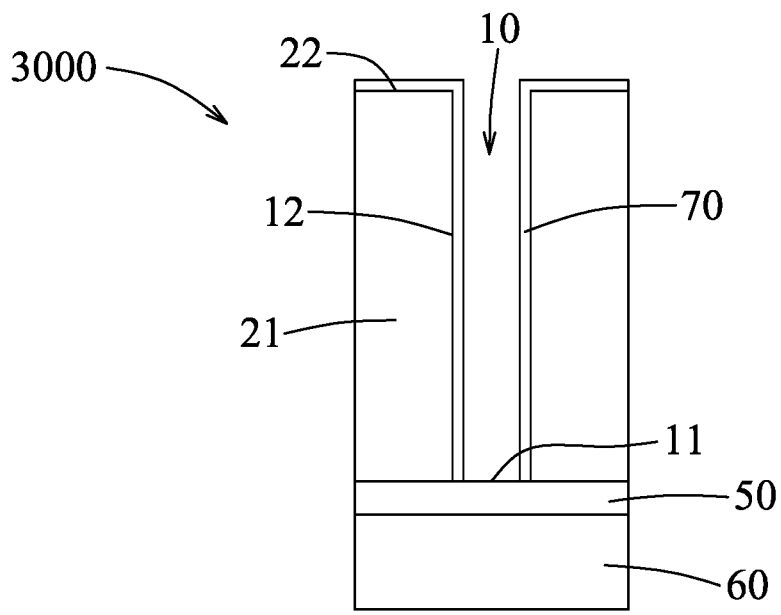

Referring to FIG. 21 and the example illustrated in FIG. 23, the method 300 proceeds to step 302, where a surface treatment is applied to the semiconductor structure 3000 such that the bottom surface 11 of the gap 10 is more hydrophilic than the lateral surfaces 12 of the gap 10. In some embodiments, the lateral surfaces 12 of the gap 10 (i.e., lateral surfaces of the raised portion 21, which are also denoted as 12) and the upper surfaces 22 of the raised portions 21 are selectively treated so as to form a treated layer 70 thereon, that acquires a hydrophobic property, and such that the bottom surface 11 is more hydrophilic than the lateral surfaces 12. In some other embodiments, the bottom surface 11 may be treated so that the bottom surface 11 is more hydrophilic than the lateral surfaces 12. For example, the lateral surfaces 12 and the upper surfaces 22 of the raised portions 21 may originally have a contact angle ranging from about 0 degree to about 5 degree and may have a contact angle ranging from about 60 degree to about 98 degree after the surface treatment. In contrast, a contact angle of the bottom surface 11, which may depend on the material of the lower element 50, is substantially not changed. In some embodiments, the treaded layer 70 is a self-assembled monolayer (SAM).

In the surface treatment, a treating agent is used for selectively treating the lateral surfaces 12 and the upper surfaces 22 of the raised portions 21, but not used for treating the bottom surface 11 of the gap 10 (i.e., an exposed surface of the lower element 50 from the gap 10). This is because the lateral surfaces 12 and the upper surfaces 22 of the raised portions 21, but not the bottom surface 11 of the gap 10, are rich in the electron-donating groups, The treating agent includes a silicon compound represented by SiR$_1$R$_2$R$_3$R$_4$, in which R$_1$ may be an electron-withdrawing group such as, —N—(CH$_3$)$_2$, —NHCH$_3$, —NH$_2$, —N—(C$_2$H$_5$)$_2$, —NCH$_3$C$_2$H$_5$, or —NHSiR$_{11}$R$_{12}$R$_{13}$; and R$_2$, R$_3$, R$_4$, R$_{11}$, R$_{12}$, and R$_{13}$ are hydrophobic groups, and are independently C$_x$H$_y$, wherein x is 1 to 3, y is 3 to 7. Other suitable groups for R$_1$, R$_2$, R$_3$ and R$_4$ are within the contemplated scope of the present disclosure. Examples of the silicon compound include dimethylamino-trimethylsilane [(CH$_3$)$_3$SiN(CH$_3$)$_2$, i.e., DMA-TMS], bis(trimethylsilyl)amine ([(CH$_3$)$_3$Si]$_2$NH, i.e., HMDS), but are not limited thereto. Other suitable chemicals for treating the lateral surfaces 12 and the upper surfaces 22 are within the contemplated scope of the present disclosure. The treating agent also includes a solvent that dissolves the silicon compound. Example of the solvent includes propylene glycol methyl ether acetate (1-methoxy-2-propanol acetate) (PGMEA), acetone, benzene, ethyl ether, heptane, perchloroethylene, dimethyl sulfoxide (DMSO), ethyl acetate, but are not limited thereto. Other suitable solvents are within the contemplated scope of the present disclosure.

Figure 24:
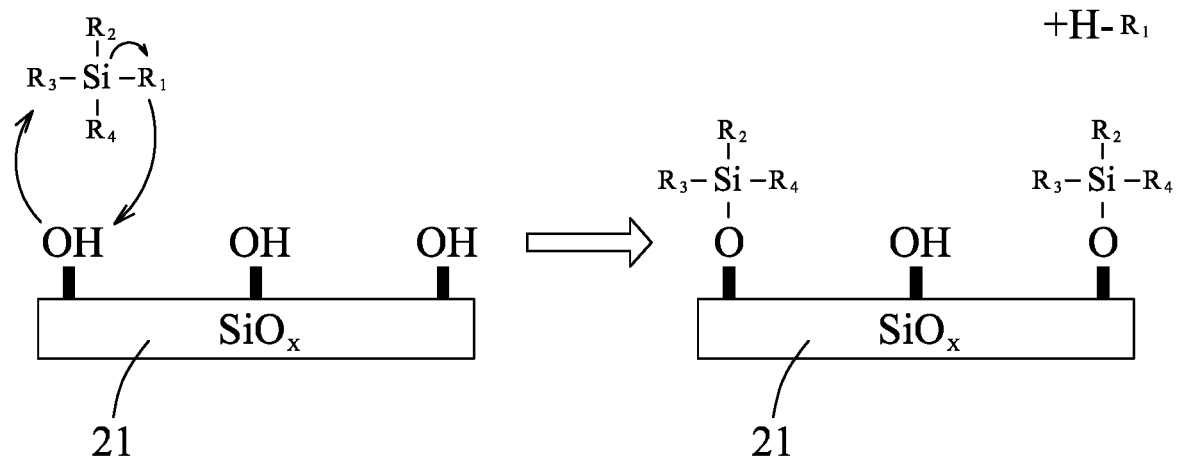

In some embodiments, referring to FIGS. 23 and 24, the silicon compound reacts with the electron-donating groups, e.g. —OH, on the lateral surfaces 12 and the upper surfaces 22 of the raised portions 21, so as to form, e.g., —O—SiR$_2$R$_3$R$_4$, which is bonded to the raised portions 21 to thereby obtain form the treated layer 70 on the lateral surfaces 12 and the upper surfaces 22, while the electron-withdrawing group —R$_1$ (of the silicon compound) serves as a leaving group and combines with —H (of —OH) on the raised portion 21, to form H—R$_1$. After the treatment, the hydrophobic groups R$_2$, R$_3$, and R$_4$ of —O—SiR$_2$R$_3$R$_4$ contribute to the hydrophobic property of the lateral surfaces 12 and the upper surfaces 22.

In some embodiments, the surface treatment may be applied at a temperature ranging from about 25° C. to about 60° C. for a time period ranging from about 0.1 minute to about 10 minutes. In some embodiments, the treated layer 70 may have a thickness ranging from about 0.5 nm to about 5 nm.

After step 302, the lateral surfaces 12 of the gap 10 and the upper surfaces 22 of the raised portion 21 are relatively hydrophobic due to the presence of the treated layer 70, while the bottom surface 11 of the gap 10 is relatively hydrophilic. Such difference is conducive for selective deposition/growing of a filling material 31 (see FIG. 25) on the hydrophilic bottom surface 11 rather than the hydrophobic lateral surfaces 12 and the upper surfaces 22. The selective deposition is performed subsequently in step 303.

Figure 25:
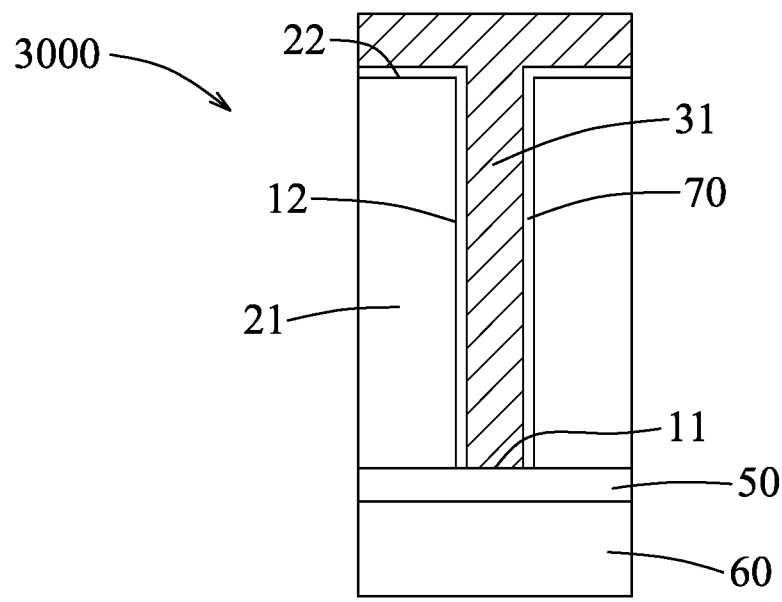

Referring to FIG. 21 and the example illustrated in FIG. 25, the method 300 proceeds to step 303, where the filling material 31 is selectively deposited on the hydrophilic bottom surface 11 of the gap 10 but not on the hydrophobic lateral surfaces 12 of the gap 10 and the hydrophobic upper surfaces 22 of the raised portion 21. The selective deposition may be achieved using, for example but not limited to, a CVD process.

In certain embodiments, in the CVD process, a hydrophilic precursor that avoids the filler element 30 being formed laterally, i.e., that selectively deposit the filling material 31 on the hydrophilic bottom surface 11 may be used. For instance, when the filling material 31 is ruthenium (Ru), the hydrophilic precursor may be Ru$_3$(CO)$_{12}$. In some embodiments, when the filling material 31 is molybdenum (Mo), the hydrophilic precursor may include $Mo(CO)_6$ Referring to FIG. 21 and the example illustrated in FIG. 26, the method 300 proceeds to step 304, where a planarization process is performed to remove an excess amount of the filling material 31, thereby forming the filler element 30. In some embodiments, the planarization process may be a CMP process. Other suitable processes for removing the excess amount of the filling material 31 are within the contemplated scope of the present disclosure. In some embodiments, the treated layer 70 deposited on the upper surface 22 of the raised portion 21 is also removed by the CMP process.

Figure 26:
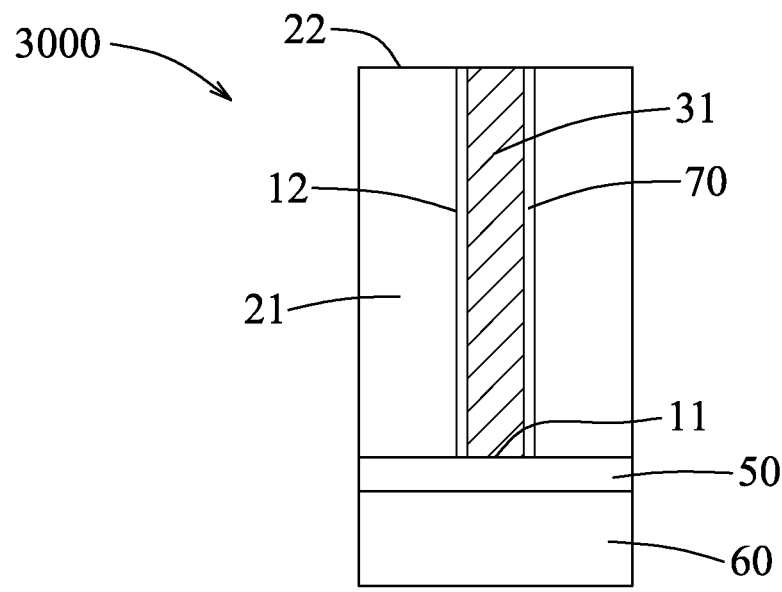
Figure 27:
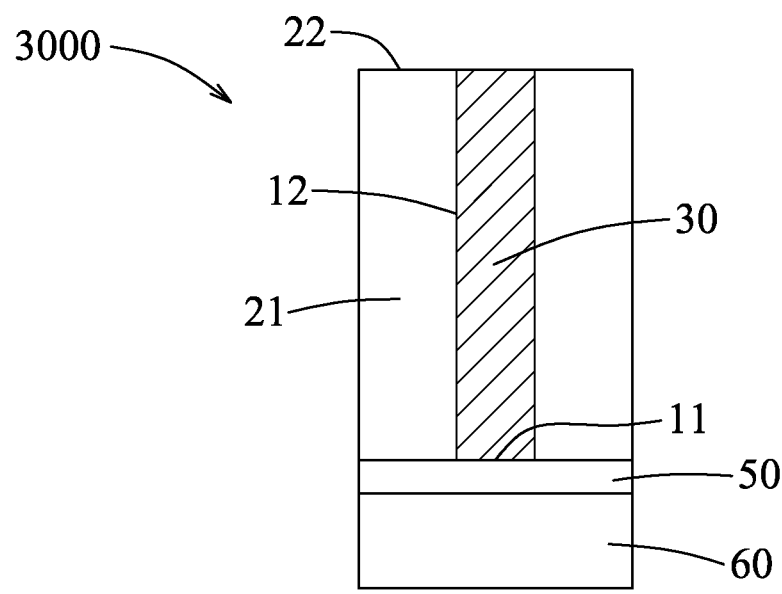

Referring to FIG. 21 and the example illustrated in FIG. 27, the method 300 proceeds to step 305, where the remaining treated layer 70 shown in FIG. 26 is removed. In some embodiments, in step 305, an ashing process is performed at a relatively high temperature to vaporize the remaining treated layer 70. Please note that the treated layer 70 is very thin (in nanometer scale) and is not drawn to scale in FIGS. 23, 25 and 26. Therefore, the clearance after removal of the remaining treated layer 70 can be omitted in FIG. 27.

In the method 300, during formation of the filler element 30, the lateral surfaces 12 of the gap 10 and the upper surfaces 22 of the raised portions 21 are treated to become hydrophobic, while the bottom surface 11 of the gap 10 remains hydrophilic. In addition, considering that the filling material 31 is selectively deposited on the hydrophilic bottom surface 11 rather than the hydrophobic lateral surfaces 12 and the upper surfaces 22, the filler element 30 is thus formed from the filling material 31 in a bottom-up manner without being formed laterally.

It should be noted that some steps in the methods 100, 200 and 300 may be modified, replaced, or eliminated without departure from the spirit and scope of the present disclosure, and those steps may not be in the order mentioned above. In alternative embodiments, other suitable methods may also be applied for forming the device.

The present disclosure provides different embodiments to fill the filling material (which is used to form the filler element) in the gap in a bottom-up manner such that the filler element can be avoided to be formed laterally. By such bottom-up manner, in some embodiments, the filling material that is undesirably formed at lateral surfaces of the gap or that undesirably overhangs the gap can be removed; and in other embodiments, prior to the gap filling, the lateral surfaces of the gap and the upper surfaces of the raised portions can be treated first, so as to prevent the filling material from being formed on the lateral surfaces of the gap and the upper surfaces of the raised portions (which might undesirably result in lateral formation of the filler element). As such, for gaps that have relatively high aspect ratios, filler elements formed therein according to the present disclosure are less likely to have voids and/or seams.

In accordance with some embodiments of the present disclosure, a method for filling a gap in a semiconductor structure includes: forming the gap between two raised portions of the semiconductor structure, the gap having a bottom surface and two lateral surfaces each extending upwardly from the bottom surface along one of the raised portions to terminate at an upper surface of a corresponding one of the raised portions; and forming a filler element in the gap in a bottom-up manner that avoids the filler element being formed laterally.

In accordance with some embodiments of the present disclosure, the filler element includes titanium nitride, aluminum oxide, tungsten, ruthenium, molybdenum, hafnium oxide, or combinations thereof.

In accordance with some embodiments of the present disclosure, forming the filler element includes: performing a deposition process to deposit a filling material which has a first portion on the bottom surface of the gap, a second portion on the lateral surfaces of the gap, and a third portion on the upper surfaces of the raised portions, until a height of the first portion is no longer increased; and performing an etching back process to etch back the filling material until the second portion and an overhang part of the third portion which overhangs the gap are removed, to thereby avoiding the filler element being formed laterally.

In accordance with some embodiments of the present disclosure, in the etching back process, an etching rate of the filling material is controlled to be greater than 0 nm/min and not greater than 2 nm/min.

In accordance with some embodiments of the present disclosure, a wet etchant is used in the etching back process, and includes an acid aqueous solution, a base aqueous solution, a hydrogen peroxide diluted aqueous solution, or an ozone aqueous solution.

In accordance with some embodiments of the present disclosure, forming the filler element further includes repeating the deposition process and the etching back process until the filling material on the bottom surface of the gap has a predetermined height, thereby obtaining the filler element.

In accordance with some embodiments of the present disclosure, an aspect ratio of the gap ranges from 1 to 3.

In accordance with some embodiments of the present disclosure, in the etching back process, a surrounding part of the third portion, which surrounds the overhang part, is removed together with the overhang part.

In accordance with some embodiments of the present disclosure, forming the filler element further includes: forming a masking layer on the etched back first portion while exposing the etched back third portion; performing a first removing process to remove the etched back third portion; performing a second removing process to remove the masking layer; and repeating the deposition process, the etching back process, the formation of the masking layer, the first removing process and the second removing process in such order until the filling material on the bottom surface of the gap has a predetermined height, thereby obtaining the filler element.

In accordance with some embodiments of the present disclosure, forming the masking layer includes: filling a masking material in the gap to cover the etched back first portion and the etched back third portion; and etching back the masking material to expose the etched back third portion, thereby obtaining the masking layer.

In accordance with some embodiments of the present disclosure, an aspect ratio of the gap ranges from 3 to 10.

In accordance with some embodiments of the present disclosure, a method for filling a gap in a semiconductor structure includes: forming the gap between two raised portions of the semiconductor structure to expose a lower element of the semiconductor structure, the lower element being made of a material different from that of the raised portions, the gap having a bottom surface on the lower element and two lateral surfaces each extending upwardly from the bottom surface along one of the raised portions to terminate at an upper surface of a corresponding one of the raised portions; applying a surface treatment to the semiconductor structure such that the bottom surface of the gap is more hydrophilic than the lateral surfaces of the gap; and forming a filler element in the gap in a bottom-up manner using a hydrophilic precursor that avoids the filler element being formed laterally.

In accordance with some embodiments of the present disclosure, the raised portions each includes silicon oxide, silicon nitride, silicon carbide, silicon oxynitride, or combinations thereof.

In accordance with some embodiments of the present disclosure, the lower element includes a metallic material.

In accordance with some embodiments of the present disclosure, in the surface treatment, the lateral surfaces of the gap and the upper surfaces of the raised portions are selectively treated to have a hydrophobic property.

In accordance with some embodiments of the present disclosure, in the surface treatment, a treating agent is used for treating the lateral surfaces of the gap and the upper surfaces of the raised portions, the treating agent including a silicon compound represented by $SiR_1R_2R_3R_4$, in which $R_1$ is $-N-(CH_3)_2-NHCH_3$, $-NH_2$, $-N-(C_2H_5)_2$, $-NCH_3C_2H_5$, or $-NHSiR_{11}R_{12}R_{13}$; and $R_2$, $R_3$, $R_4$, $R_{11}$, $R_{12}$, and $R_{13}$ are independently $C_xH_y$, x being 1 to 3, y being 3 to 7.

In accordance with some embodiments of the present disclosure, a method for filling a gap in a semiconductor structure includes; forming the gap between two raised portions of the semiconductor structure, the gap having a bottom surface and two lateral surfaces each extending upwardly from the bottom surface along one of the raised portions to terminate at an upper surface of a corresponding one of the raised portions, each of the raised portions including a stack which has a plurality of channel layers and a plurality of sacrificial layers disposed to alternate with the channel layers; performing a deposition process to deposit a filling material which has a first portion on the bottom surface of the gap, a second portion on the lateral surfaces of the gap, and a third portion on the upper surfaces of the raised portions, until a height of the first portion is no longer increased; and performing an etching back process to etch back the filling material until the second portion and an overhang part of the third portion which overhangs the gap are removed.

In accordance with some embodiments of the present disclosure, the stack further includes a hard mask disposed on the channel layers and the sacrificial layers; each of the raised portions further includes a sacrificial liner formed to cover the stack; the semiconductor structure further includes a dielectric portion formed between the raised portions, an upper surface of the dielectric portion serving as the bottom surface of the gap; and each of the lateral surfaces of the gap extends from the upper surface of the dielectric portion along a side surface of the sacrificial liner of the corresponding one of the raised portions to terminate at an upper surface of the sacrificial liner.

In accordance with some embodiments of the present disclosure, each of raised portions includes an upper segment on the stack, the upper segment including a dummy gate part and two gate spacers disposed at two opposite sides of the dummy gate part; each of the sacrificial layers has two inner spacers at two opposite sides thereof so as to prevent the sacrificial layers from being accessed through the gap; the semiconductor structure further includes a semiconductor substrate, and a semiconductor portion which is formed to interconnect each of the raised portions to the semiconductor substrate; a surface of the semiconductor portion, which is exposed from the raised portions, serves as the bottom surface of the gap; and each of the lateral surfaces of the gap extends from the surface of the semiconductor portion along side surfaces of the stack and the upper segment of the corresponding raised portion to terminate at an upper surface of the upper segment.

In accordance with some embodiments of the present disclosure, the method further includes: forming a masking layer on the etched back first portion while exposing the etched back third portion; forming a masking layer on the etched back first portion while exposing the etched back third portion; performing a first removing process to remove the etched back third portion; performing a second removing process to remove the masking layer; and repeating the deposition process, the etching back process, the formation of the masking layer, the first removing process and the second removing process until the filling material on the bottom surface of the gap shields a bottommost one of the channel layers of each of the raised portions.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for filling a gap in a semiconductor structure, comprising:
   forming the gap between two raised portions of the semiconductor structure, the two raised portions respectively having two upper surfaces, the gap having a bottom surface and two lateral surfaces each extending upwardly from the bottom surface along one of the raised portions to terminate at a corresponding one of the two upper surfaces; and
   forming a filler element in the gap in a bottom-up manner that avoids the filler element being formed laterally, wherein forming the filler element includes:
      performing a deposition process to deposit a filling material which has a first portion on the bottom surface of the gap, a second portion on the two lateral surfaces of the gap, and a third portion on the two upper surfaces of the two raised portions, until a height of the first portion is no longer increased; and
      performing an etching back process to etch back the filling material until the second portion and an overhang part of the third portion which overhangs the gap are removed, so as to avoid the filler element being formed laterally; and
   wherein the second portion formed on the two lateral surfaces of the gap during the deposition process includes a metal-containing material, the second portion being removed to expose the two lateral surfaces of the gap after the etching back process.

2. The method according to claim 1, wherein the filler element includes titanium nitride, aluminum oxide, tungsten, ruthenium, molybdenum, hafnium oxide, or combinations thereof.

3. The method according to claim 1, wherein, in the etching back process, an etching rate of the filling material is controlled to be greater than 0 nm/min and not greater than 2 nm/min.

4. The method according to claim 1, wherein a wet etchant is used in the etching back process, and includes an acid aqueous solution, a base aqueous solution, a hydrogen peroxide diluted aqueous solution, or an ozone aqueous solution.

5. The method according to claim 1, wherein forming the filler element further includes
repeating the deposition process and the etching back process until the filling material on the bottom surface of the gap has a predetermined height, thereby obtaining the filler element.

6. The method according to claim 5, wherein an aspect ratio of the gap ranges from 1 to 3.

7. The method according to claim 1, wherein, in the etching back process, a surrounding part of the third portion, which surrounds the overhang part, is removed together with the overhang part.

8. The method according to claim 1, wherein forming the filler element further includes:
forming a masking layer on the etched back first portion while exposing the etched back third portion;
performing a first removing process to remove the etched back third portion;
performing a second removing process to remove the masking layer; and
repeating the deposition process, the etching back process, the formation of the masking layer, the first removing process and the second removing process in such order until the filling material on the bottom surface of the gap has a predetermined height, thereby obtaining the filler element.

9. The method according to claim 8, wherein forming the masking layer includes:
filling a masking material in the gap to cover the etched back first portion and the etched back third portion; and
etching back the masking material to expose the etched back third portion, thereby obtaining the masking layer.

10. The method according to claim 8, wherein an aspect ratio of the gap ranges from 3 to 10.

11. A method for filling a gap in a semiconductor structure, comprising:
forming the gap between two raised portions of the semiconductor structure to expose a lower element of the semiconductor structure, the two raised portions respectively having two upper surfaces, the lower element being made of a material different from a material of the two raised portions, the gap having a bottom surface on the lower element and two lateral surfaces each extending upwardly from the bottom surface along one of the raised portions to terminate at a corresponding one of the two upper surfaces;
applying a surface treatment to the semiconductor structure, such that the two lateral surfaces are respectively formed with two treated layers, and such that after the surface treatment, the bottom surface of the gap is more hydrophilic than the two lateral surfaces of the gap;
forming a filler element in the gap in a bottom-up manner using a hydrophilic precursor that avoids the filler element being formed laterally; and
removing the two treated layers after forming the filler element.

12. The method according to claim 11, wherein the two raised portions each includes silicon oxide, silicon nitride, silicon carbide, silicon oxynitride, or combinations thereof.

13. The method according to claim 11, wherein the lower element includes a metallic material.

14. The method according to claim 11, wherein, in the surface treatment, the two lateral surfaces of the gap and the upper surfaces of the raised portions are selectively treated to have a hydrophobic property.

15. The method according to claim 11, wherein, in the surface treatment, a treating agent is used for treating the two lateral surfaces of the gap and the two upper surfaces of the raised portions, the treating agent including a silicon compound represented by
$SiR_1R_2R_3R_4$, in which
$R_1$ is $-N-(CH_3)_2-NHCH_3$, $-NH_2$, $-N-(C_2H_5)_2$, $-NCH_3C_2H_5$, or $-NHSiR_{11}R_{12}R_{13}$; and
$R_2$, $R_3$, $R_4$, $R_{11}$, $R_{12}$, and $R_{13}$ are independently $C_xH_y$, x being 1 to 3, y being 3 to 7.

16. A method for filling a gap in a semiconductor structure, comprising:
forming the gap between two raised portions of the semiconductor structure, the two raised portions respectively having two upper surfaces, the gap having a bottom surface and two lateral surfaces each extending upwardly from the bottom surface along one of the two raised portions to terminate at a corresponding one of the two upper surfaces, each of the two raised portions including a stack which has channel layers and sacrificial layers disposed to alternate with the channel layers;
performing a deposition process to deposit a filling material which has a first portion on the bottom surface of the gap, a second portion on the two lateral surfaces of the gap, and a third portion on the two upper surfaces of the two raised portions, until a height of the first portion is no longer increased; and
performing an etching back process to etch back the filling material until the second portion and an overhang part of the third portion which overhangs the gap are removed,
wherein the second portion formed on the two lateral surfaces of the gap during the deposition process includes a metal-containing material, the second portion being removed to expose the two lateral surfaces of the gap after the etching back process.

17. The method according to claim 16, wherein:
the stack further includes a hard mask disposed on the channel layers and the sacrificial layers;
each of the two raised portions further includes a sacrificial liner formed to cover the stack;
the semiconductor structure further includes a dielectric portion formed between the two raised portions, an upper surface of the dielectric portion serving as the bottom surface of the gap; and
each of the two lateral surfaces of the gap extends from the upper surface of the dielectric portion along a side surface of the sacrificial liner of a corresponding one of the two raised portions to terminate at an upper surface of the sacrificial liner.

18. The method according to claim 16, wherein:
each of the two raised portions includes an upper segment on the stack, the upper segment including a dummy gate part and two gate spacers disposed at two opposite sides of the dummy gate part;
each of the sacrificial layers has two inner spacers at two opposite sides thereof so as to prevent the sacrificial layers from being accessed through the gap;
the semiconductor structure further includes a semiconductor substrate, and a semiconductor portion which is formed to interconnect each of the two raised portions to the semiconductor substrate;

a surface of the semiconductor portion, which is exposed from the two raised portions, serves as the bottom surface of the gap; and each of the two lateral surfaces of the gap extends from the surface of the semiconductor portion along side surfaces of the stack and the upper segment of a corresponding one of the two raised portions to terminate at an upper surface of the upper segment of the corresponding one of the two raised portions.

19. The method according to claim 18, further comprising:

forming a masking layer on the etched back first portion while exposing the etched back third portion;

performing a first removing process to remove the etched back third portion;

performing a second removing process to remove the masking layer; and repeating the deposition process, the etching back process, the formation of the masking layer, the first removing process and the second removing process until the filling material on the bottom surface of the gap shields a bottommost one of the channel layers of each of the two raised portions.

20. The method of claim 11, wherein the two treated layers are removed by an ashing process.

* * * * *